(12) United States Patent
Imahori et al.

(10) Patent No.: US 11,592,709 B2
(45) Date of Patent: Feb. 28, 2023

(54) LIGHT EMITTING DEVICE AND DISPLAY DEVICE

(71) Applicant: Funai Electric Co., Ltd., Osaka (JP)

(72) Inventors: Yoshimasa Imahori, Osaka (JP); Tatsuya Ito, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days.

(21) Appl. No.: 17/872,405

(22) Filed: Jul. 25, 2022

(65) Prior Publication Data

US 2022/0357621 A1 Nov. 10, 2022

Related U.S. Application Data

(63) Continuation of application No. 17/333,595, filed on May 28, 2021, now Pat. No. 11,422,408.

(30) Foreign Application Priority Data

Jun. 5, 2020 (JP) .............................. JP2020-098247

(51) Int. Cl.
*G02F 1/13357* (2006.01)
*H01L 25/075* (2006.01)
(Continued)

(52) U.S. Cl.
CPC .. *G02F 1/133611* (2013.01); *G02F 1/133603* (2013.01); *G02F 1/133606* (2013.01);
(Continued)

(58) Field of Classification Search
CPC ......... G02F 1/133603; G02F 1/133608; G02F 1/133606
See application file for complete search history.

(56) References Cited

U.S. PATENT DOCUMENTS

| 2009/0059563 | A1 | 3/2009 | Takata et al. |
| 2011/0221994 | A1 | 9/2011 | Kamiyama et al. |
| 2019/0113808 | A1* | 4/2019 | Isono ................ G02F 1/133605 |

FOREIGN PATENT DOCUMENTS

| JP | 2012-22977 A | 2/2012 |
| JP | 2019-46667 A | 3/2019 |
| JP | 2019-46668 A | 3/2019 |

OTHER PUBLICATIONS

The extended European search report for the corresponding European application No. 21177139.9 dated Nov. 4, 2021.

* cited by examiner

*Primary Examiner* — Andrew J Coughlin
(74) *Attorney, Agent, or Firm* — Global IP Counselors, LLP

(57) ABSTRACT

A light emitting device comprises a light emitting substrate with a plurality of light emitting elements, a luminance equalizer sheet provided opposite the light emitting substrate and having a plurality of through holes for transmitting light irradiated from the light emitting elements; and a holding member having a first holding surface that supports the light emitting substrate and has a first engagement portion that is engaged with the first emitting substrate, and a second holding surface that supports at least an edge portion of the luminance equalizer sheet and has a second engagement portion that is engaged with the edge portion of the luminance equalizer sheet, the first engagement portion and the second engagement portion being aligned with respect to each other on a predetermined plane, and a distance between the first holding surface and the second holding surface increasing or decreasing as moving away from the predetermined plane.

20 Claims, 9 Drawing Sheets

(51) Int. Cl.
*H01L 33/58* (2010.01)
*H01L 33/60* (2010.01)

(52) U.S. Cl.
CPC .... *G02F 1/133608* (2013.01); *H01L 25/0753* (2013.01); *H01L 33/58* (2013.01); *H01L 33/60* (2013.01); *G02F 2201/56* (2013.01)

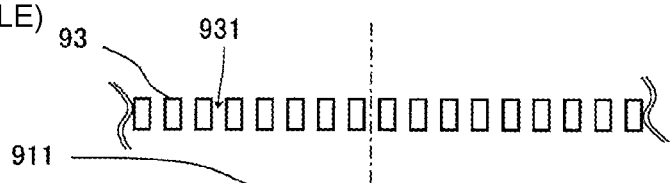
FIG. 4A (COMPARATIVE EXAMPLE)
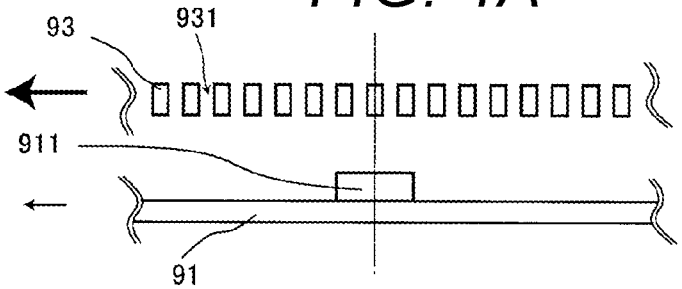
FIG. 4B
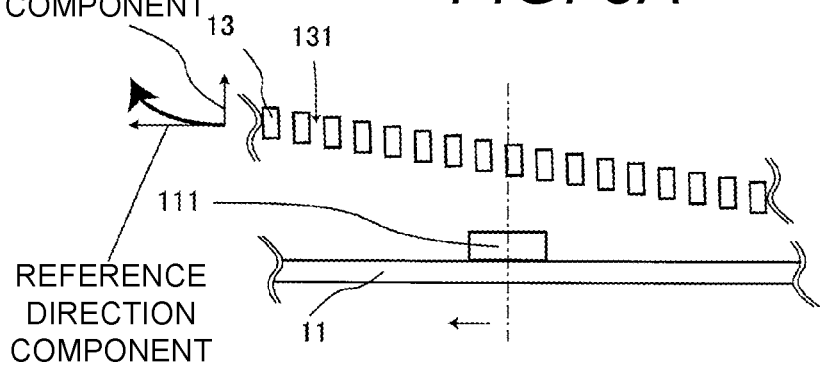
FIG. 5A
FIG. 5B

LIGHT EMITTING DEVICE AND DISPLAY DEVICE

CROSS-REFERENCE TO RELATED APPLICATIONS

This is a continuation application of U.S. patent application Ser. No. 17/333,595 filed on May 28, 2021, which claims priority to Japanese Patent Application No. 2020-098247 filed on Jun. 5, 2020. The entire disclosures of U.S. patent application Ser. No. 17/333,595 and Japanese Patent Application No. 2020-098247 are hereby incorporated herein by reference.

BACKGROUND

Field of the Invention

The present invention generally relates to a light emitting device and a display device. More specifically, the present invention relates to a light emitting device and a display device equipped with a light emitting substrate having a light emitting element and a luminance equalizer sheet.

Background Information

Some light emitting devices are equipped with a light emitting substrate having a light emitting element and a luminance equalizer sheet (see Japanese Patent Application Publication No. 2012-22977 (Patent Literature 1), for example).

The light emitting device described in Patent Literature 1 above uses a luminance equalizer sheet with a plurality of through holes of different sizes in order to obtain illumination light with uniform illuminance distribution. In the light emitting device described in Patent Literature 1 above, a metal material is used as the material of the light emitting substrate, and an ultrafine-cellular foam light reflection member is used as the material of the luminance equalizer sheet.

SUMMARY

In order to obtain a uniform illuminance distribution, the relative positional relationship between each light emitting element and the through hole pattern of the luminance equalizer sheet corresponding to each light emitting element is important. Any misalignment in the relative positional relationship above will result in a decrease in luminance uniformity. Therefore, in order to suppress the misalignment of the relative positional relationship above, a holding member is generally used to fix the relative positions of the light emitting element and the luminance equalizer sheet.

In the light emitting device described in Patent Literature 1 above, as described above, the materials of the light emitting substrate and the luminance equalizer sheet are different, and thus their respective linear expansion coefficients are also different. Therefore, the amount of expansion and contraction of the light emitting substrate due to temperature changes differs from the amount of expansion and contraction of the luminance equalizer sheet. When the light emitting substrate and the luminance equalizer sheet expand or contract due to temperature changes, no misalignment occurs in the relative positional relationship between each light emitting element and the through hole pattern of the luminance equalizer sheet corresponding to each light emitting element at a positioning point (a fixed position) where the relative position is fixed. However, at a position away from the positioning point (the fixed position) above, the difference in the linear expansion coefficients of the light emitting substrate and the luminance equalizer sheet causes the misalignment in the relative positioning relationship above. This misalignment becomes larger the farther the position is away from the positioning point (the fixed position) above, resulting in the deterioration of luminance uniformity. In particular, light emitting devices installed in vehicles have a large temperature fluctuation range, and thus the deterioration of luminance uniformity caused by temperature changes is unavoidable.

One object is to provide a light emitting device and a display device that can suppress deterioration of luminance uniformity caused by temperature changes by reducing misalignment of the relative positional relationship of the light emitting substrate and the luminance equalizer sheet caused by temperature changes.

In view of the state of the known technology and in accordance with an aspect of the present invention, a light emitting device comprises a light emitting substrate with a plurality of light emitting elements, a luminance equalizer sheet provided opposite the light emitting substrate and having a plurality of through holes for transmitting light irradiated from the light emitting elements; and a holding member having a first holding surface that supports the light emitting substrate and has a first engagement portion that is engaged with the first emitting substrate, and a second holding surface that supports at least an edge portion of the luminance equalizer sheet and has a second engagement portion that is engaged with the edge portion of the luminance equalizer sheet, the first engagement portion and the second engagement portion being aligned with respect to each other on a predetermined plane, and a distance between the first holding surface and the second holding surface increasing or decreasing as moving away from the predetermined plane.

BRIEF DESCRIPTION OF THE DRAWINGS

Referring now to the attached drawings which form a part of this original disclosure:

FIG. 4A is a schematic diagram showing a positional relationship between a light emitting substrate and a luminance equalizer sheet at room temperature in a light emitting device in accordance with a comparative example;

FIG. 4B is a schematic diagram showing the positional relationship between the light emitting substrate and the luminance equalizer sheet at high temperature in the light emitting device in accordance with the comparative example;

FIG. 5A is a schematic diagram showing a positional relationship between a light emitting substrate and a luminance equalizer sheet at room temperature in a light emitting device of the display device in accordance with the first embodiment;

FIG. 5B is a schematic diagram showing the positional relationship between the light emitting substrate and the luminance equalizer sheet at high temperature in the light emitting device of the display device in accordance with the first embodiment;

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

In the present disclosure, the left-right direction or horizontal direction as viewed from a front surface side of a display device is described as an X direction. The up-down direction or vertical direction as viewed from the front surface side of the display device is described as a Y direction. The direction extending between a rear surface side and the front surface side of the display device is described as a Z direction.

First Embodiment (Configuration of Display Device)

Figure 1:
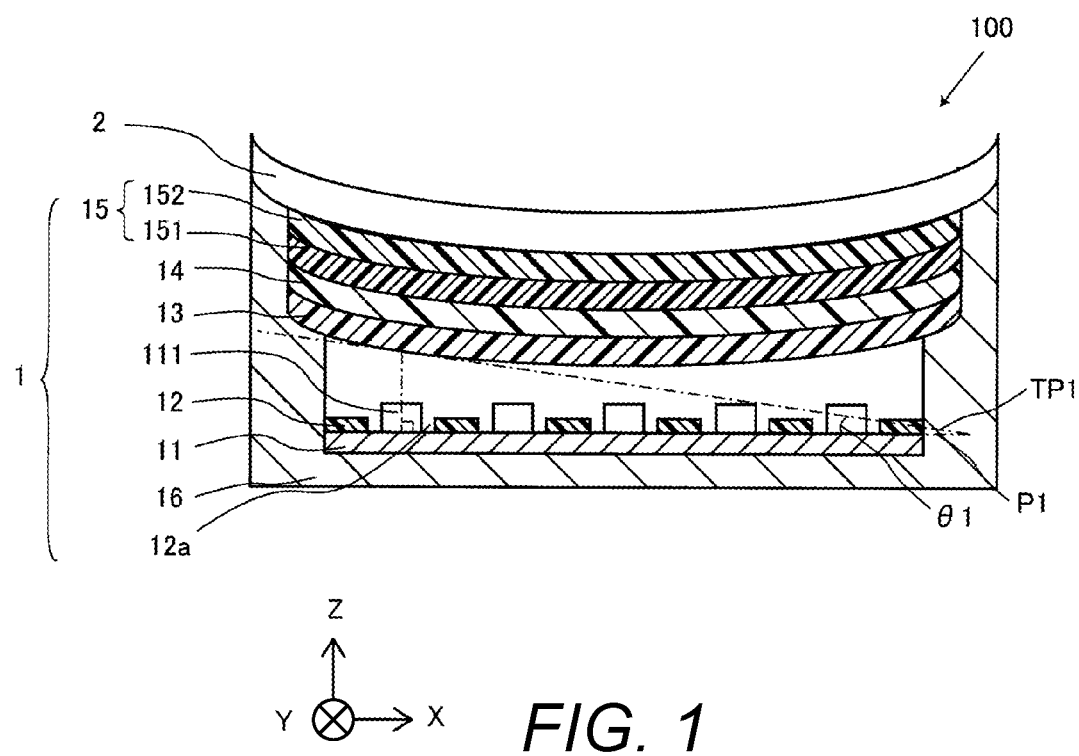
FIG. 1 is a cross-sectional view of a display device in accordance with a first embodiment.
Figure 2:
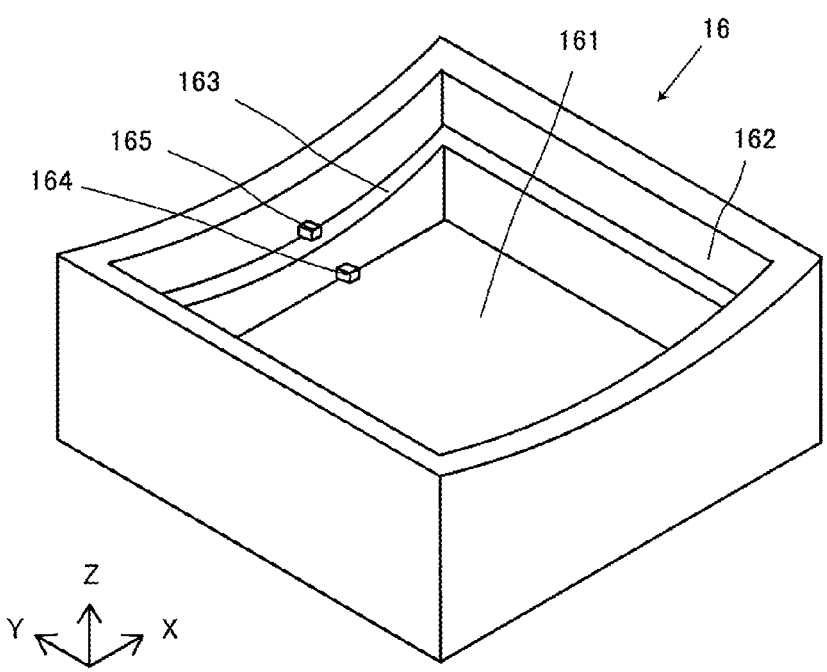
FIG. 2 is a perspective view of a holding member of the display device in accordance with the first embodiment.

With reference to FIGS. 1 and 2, the configuration of a display device 100 according to a first embodiment will be described.

As shown in FIG. 1, the display device 100 according to the first embodiment is equipped with a light emitting device or backlight 1 and a display panel 2. FIG. 1 is a cross-sectional view of the display device 100 taken along the X direction.

The light emitting device 1 has a light emitting substrate 11, a reflective sheet 12, a luminance equalizer sheet (e.g., a luminance uniformity sheet or a homogenizer) 13, a diffusion member or diffuser 14, an optical sheet 15, and a holding member or casing 16. The light emitting substrate 11, the reflective sheet 12, the luminance equalizer sheet 13, the diffusion member 14 and the optical sheet 15 are arranged in this order inside the holding member 16.

The light emitting substrate 11 is a printed wiring board and includes a plurality of light emitting elements 111 provided on a front surface side and a connector (not shown) to which power is supplied from outside. The light emitting substrate 11 has a flat (planar) shape. The light emitting substrate 11 includes a glass epoxy substrate using FR4 (Flame Retardant 4), a glass composite substrate using CEM3 (Composite Epoxy Material) 3), or a metal substrate, such as aluminum, but is not limited to these. The linear expansion coefficient of the light emitting substrate 11 is smaller than the linear expansion coefficient of the luminance equalizer sheet 13.

The light emitting substrate 11 has a rectangular shape including four sides in plan view. A plurality of notches (not shown) are formed on a pair of sides of the light emitting substrate 11 along the X direction and at least one of a pair of sides of the light emitting substrate 11 along the Y direction, respectively, to engage with light emitting substrate engaging protrusions 164 (e.g., engaging protrusions) of the holding member 16, respectively (see FIG. 2). The light emitting substrate 11 is positioned in the X direction by the notches formed on the pair of sides along the X direction and the corresponding light emitting substrate engaging protrusions 164. The light emitting substrate 11 is positioned in the Y direction by the notch formed on the side along the Y direction and the corresponding light emitting substrate engaging protrusion 164. Thus, the light emitting substrate 11 is fixed so as to be relatively positioned relative to the luminance equalizer sheet 13 by the notches and the light emitting substrate engaging protrusions 164. As understood from FIG. 3, the notches formed on the pair of sides along the X direction are formed at center portions of the pair of sides along the X direction corresponding to the light emitting substrate engaging protrusions 164, but can be formed at points away from the center portions corresponding to the light emitting substrate engaging protrusions 164.

The light emitting elements 111 are configured to emit light when energized. The light emitting elements 111 include an LED (Light Emitting Diode).

The reflective sheet 12 is disposed between the light emitting substrate 11 and the luminance equalizer sheet 13 in the Z direction. The reflective sheet 12 has a plurality of apertures 12a through which the light emitting elements 111 and their vicinities are exposed, respectively. The reflective sheet 12 is fixed to a surface of the light emitting substrate 11 on which the light emitting elements 111 are mounted so as to avoid interfering with the light emitting elements 111 by the apertures 12a. The reflective sheet 12 is fixed to the light emitting substrate 11 by a fixing method, such as double-sided tape. The reflective sheet 12 is made of, but not limited to, polyethylene terephthalate. The reflective sheet 12 increases the light utilization efficiency by re-reflecting light that has been reflected by the luminance equalizer sheet 13, the diffusion member 14 or the optical sheet 15 and returned to the light emitting substrate 11, and also makes the luminance distribution uniform by making light advance from areas other than the light emitting elements 111 toward a light exit surface of the light emitting device 1.

The luminance equalizer sheet 13 is disposed between the reflective sheet 12 and the diffusion member 14 in the Z direction. The luminance equalizer sheet 13 is disposed spaced away at a distance of about 0.5 mm to 10 mm from the light emitting substrate 11. The luminance equalizer sheet 13 has a plurality of through holes 131 (see FIG. 5) of different sizes for transmitting the light irradiated from the light emitting elements 111. In the luminance equalizer sheet 13, some of the light irradiated from the light emitting elements 111 is transmitted through the through holes 131, while other part of the light are reflected back toward the light emitting substrate 11 in areas where the through holes 131 are not formed. The luminance equalizer sheet 13 is designed by considering the size of the through holes 131, the number of the through holes 131 and the arrangement of the through holes 131 corresponding to the light emitting elements 111 so that the luminance in a light emitting surface or front surface of the light emitting device 1 is made uniform. The luminance equalizer sheet 13 is formed, for example, such that the through holes 131 that have a plurality of different sizes, ranging from about 0.2 mm to 2 mm, are densely arranged at intervals of about 0.2 mm. By using this luminance equalizer sheet 13, the reflection of light is repeated between the reflective sheet 12 on the light emitting substrate 11 and the luminance equalizer sheet 13, and the luminance uniformity can be improved.

The luminance equalizer sheet 13 has a rectangular shape including four sides in plan view. A plurality of notches (not shown) is formed on a pair of sides of the luminance equalizer sheet 13 along the X direction and at least one of a pair of sides of the luminance equalizer sheet 13 along the Y direction, respectively, to engage with luminance equalizer sheet engaging protrusions 165 (e.g., engaging protrusions) of the holding member 16, respectively, (see FIG. 2). The luminance equalizer sheet 13 is positioned in the X direction by the notches formed on the pair of sides along the X direction and the corresponding luminance equalizer sheet engaging protrusions 165. The luminance equalizer sheet 13 is positioned in the Y direction by the notch formed on the side along the Y direction and the corresponding luminance equalizer sheet engaging protrusion 165. Thus, the luminance equalizer sheet 13 is fixed so as to be relatively positioned relative to the light emitting substrate 11 by the notches and the luminance equalizer sheet engaging protrusions 165. As understood from FIG. 3, the notches formed on the pair of sides along the X direction are formed at center portions of the pair of sides along the X direction corresponding to the luminance equalizer sheet engaging protrusions 165, but can be formed or at points away from the center portions corresponding to the luminance equalizer sheet engaging protrusions 165.

The luminance equalizer sheet 13 is made of, but not limited to, polyethylene terephthalate. The linear expansion coefficient of the luminance equalizer sheet 13 is larger than the linear expansion coefficient of the light emitting substrate 11. Thus, in the illustrated embodiment, the luminance equalizer sheet 13 is made of a different material from the light emitting substrate 11.

As shown in FIG. 1, the luminance equalizer sheet 13 has a curved shape. Specifically, the luminance equalizer sheet 13 has a single curved shape. More specifically, the luminance equalizer sheet 13 has a curved cross sectional shape in the cross section of the display device 100 taken along the X direction or a ZX plane (FIG. 1), while the luminance equalizer sheet 13 has a flat cross sectional shape in the cross section of the display device 100 taken along the Y direction or a YZ plane. In particular, in the illustrated embodiment, the luminance equalizer sheet 13 has a curved shape that is convex toward the light emitting substrate 11 in the cross section of the display device 100 taken along the X direction. The luminance equalizer sheet 13 is curved so that an angle $\theta 1$ between a plane P1 of the light emitting substrate 11 and a tangent plane TP1 of the luminance equalizer sheet 13 in a perpendicular direction of the plane P1 of the light emitting substrate 11 increases as moving away from a positioning position where the notch is formed. Specifically, the luminance equalizer sheet 13 is curved so that the angle $\theta 1$ between the plane P1 of the light emitting substrate 11 (i.e., a tangent plane of the light emitting substrate 11 at a position of the light emitting substrate 11) and the tangent plane TP1 of the luminance equalizer sheet 13 at a position of the luminance equalizer sheet 13 that is located in the perpendicular direction of the plane P1 of the light emitting substrate 11 relative to the position of the light emitting substrate 11 increases as the position of the light emitting substrate 11 moving away from the positioning position where the notch is formed. In the illustrated embodiment, the notches of the light emitting substrate 11 are formed at the center portions of the pair of sides along the X direction, while the notches of the luminance equalizer sheet 13 are formed at the center portions of the pair of sides along the X direction. Thus, as shown in FIG. 1, the angle $\theta 1$ monotonically increases as moving outward in the X direction relative to a longitudinal center plane of the display device 100 that is a YZ plane and extends through the notches of the light emitting substrate 11 and the notches of the luminance equalizer sheet 13.

The positioning position where the notch of the luminance equalizer sheet 13 is formed is located at a position where a plane orthogonal to the tangent plane TP1 of the luminance equalizer sheet 13 and a plane orthogonal to the plane P1 of the light emitting substrate 11 overlap each other. Specifically, in this embodiment, the positioning position of the luminance equalizer sheet 13 is provided at the top of the curved shape of the luminance equalizer sheet 13, and the positioning position of the light emitting substrate 11 is provided at a portion located in the perpendicular direction or Z direction from this top. More specifically, as shown in FIG. 1, the plane orthogonal to the tangent plane TP1 of the luminance equalizer sheet 13 at the center portions of the pair of sides of the luminance equalizer sheet 13 along the X direction (at the positioning position of the luminance equalizer sheet 13) matches with the plane orthogonal to the plane P1 of the light emitting substrate 11 at the center portions of the pair of sides of the light emitting substrate 11 (at the positioning position of the light emitting substrate 11), which also matches with the longitudinal center plane of the display device 100 that is a YZ plane and extends through the notches of the light emitting substrate 11 and the notches of the luminance equalizer sheet 13.

The diffusion member 14 is disposed between the luminance equalizer sheet 13 and the optical sheet 15. The diffusion member 14 is made of polycarbonate, for example. As shown in FIG. 1, the diffusion member 14 is formed of a plate member molded into a curved shape that is convex toward the luminance equalizer sheet 13 in the cross section of the display device 100 taken along the X direction. The curved shape of the diffusion member 14 is a curved shape corresponding to the curved shape of the luminance equalizer sheet 13. The curved shape of the diffusion member 14 is a curved shape extending along a curved holding portion 163 (see FIG. 2) of the holding member 16 described later. Along the curved shape of the diffusion member 14, the luminance equalizer sheet 13 has the curved shape that is convex toward the light emitting substrate 11. The diffusion member 14 may be formed of a sheet member. The diffusion member 14 diffuses the light that passes through the luminance equalizer sheet 13 and enters the diffusion member 14, and can also guide the light to the point where the through holes 131 are not formed on the front surface side of the luminance equalizer sheet 13.

The optical sheet 15 is disposed between the diffusion member 14 and the display panel 2. The optical sheet 15 includes, for example, a prism sheet 151 to increase the light utilization efficiency of the light emitting device 1, and a polarization control sheet 152 to increase the light utilization efficiency of the display panel 2. The optical sheet 15 may further include a viewing angle control sheet that narrows the viewing angle of the display device 100. The curved shape of the optical sheet 15 is a curved shape that corresponds to the curved shape of the luminance equalizer sheet 13.

Figure 3:
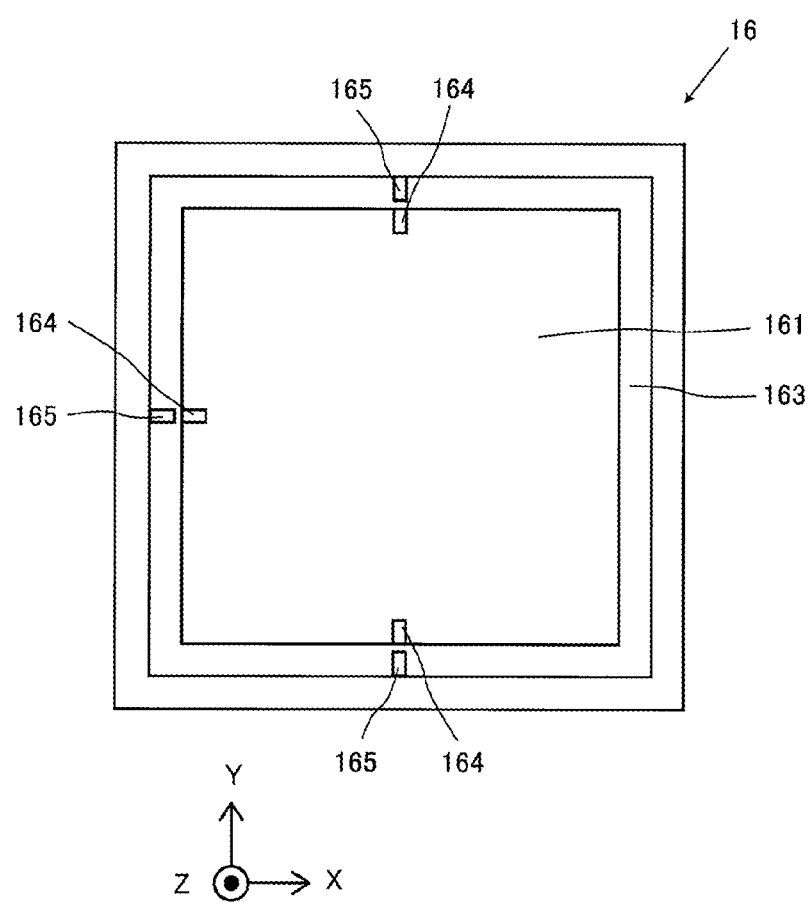
FIG. 3 is a front elevational view of the holding member of the display device in accordance with the first embodiment.

As shown in FIGS. 2 and 3, the holding member 16 is a box shape with an opening on the front surface side and has a bottom portion 161 and four side portions 162. The light emitting substrate 11 is disposed on the bottom portion 161. The light emitting substrate 11 is fixed to the bottom portion 161 by a fixing method such as double-sided tape. Since the light emitting substrate 11 generates heat, the double-sided tape is selected by considering heat transfer properties. On the front surface side of the light emitting substrate 11 on the bottom portion 161, the reflective sheet 12, the luminance equalizer sheet 13, the diffusion member 14 and the optical sheet 15 are arranged in this order. The side portions 162 form four side walls of the box-shaped holding member 16. The side portions 162 restrict the positions of the light emitting substrate 11, the reflective sheet 12, the luminance equalizer sheet 13, the diffusion member 14 and the optical sheet 15, and also prevent light from leaking and foreign matter from entering. The side portions 162 have a curved holding portion 163 that protrudes inward between the light emitting substrate 11 and the luminance equalizer sheet 13 and is formed in a curved shape that is convex toward the light emitting substrate 11 at the side portions 162 along the X direction and a flat shape at the side portions 162 along the Y direction. The curved holding portion 163 forms a step that supports the periphery of the luminance equalizer sheet 13 and holds the curved shape of the luminance equalizer sheet 13. The curved holding portion 163 holds the luminance equalizer sheet 13 between itself and the diffusion member 14. The side portions 162 fix the diffusion member 14 and the optical sheet 15 using tape and the like.

As shown in FIGS. 2 and 3, the bottom portion 161 has the light emitting substrate engaging protrusions 164 for engaging with the notches of the light emitting substrate 11. Specifically, in the illustrated embodiment, the bottom portion 161 has the light emitting substrate engaging protrusions 164 that protrude inward from the pair of the side portions 162 along the X direction and at least one side portion of the pair of the side portions 162 along the Y direction.

As shown in FIGS. 2 and 3, the curved holding portion 163 includes a pair of curved sections extending along the X direction and a pair of flat sections extending along the Y direction. The curved sections of the curved holding portion 163 has a curved shape as viewed in the Y direction that corresponds to the curved shape of the luminance equalizer sheet 13. The flat sections of the curved holding portion 163 has a flat shape as viewed in the X direction. The curved holding portion 163 has the luminance equalizer sheet engaging protrusions 165 for engaging with the notches of the luminance equalizer sheet 13. Specifically, in the illustrated embodiment, the curved holding portion 163 has the luminance equalizer sheet engaging protrusions 165 on the pair of the curved sections of the curved holding portion 163 along the X direction and at least one of the pair of the flat sections of the curved holding portion 163 along the Y direction, as shown in FIGS. 2 and 3. In particular, in the illustrated embodiment, as shown in FIG. 3, the luminance equalizer sheet engaging protrusions 165 on the curved sections of the curved holding portion 163 protrude inward from the side portions 162 along the X direction, respectively, and the luminance equalizer sheet engaging protrusion 165 on one of the flat sections of the curved holding portion 163 protrude inward from the side portion 162 along the Y direction.

The holding member 16 positions the light emitting substrate 11 by the light emitting substrate engaging protrusions 164 that define positioning positions of the light emitting substrate 11, respectively. The holding member 16 positions the luminance equalizer sheet 13 by the luminance equalizer sheet engaging protrusions 165 that define positioning positions of the luminance equalizer sheet 13, respectively. The holding member 16 fixes the light emitting substrate 11 and the luminance equalizer sheet 13 so that the light emitting substrate 11 and the luminance equalizer sheet 13 can be relatively positioned. The luminance equalizer sheet engaging protrusions 165 are arranged at a position where a tangent plane of the curved holding portion 163 along the X direction is parallel to the bottom portion 161 of the holding member 16. The luminance equalizer sheet engaging protrusions 165 formed on the pair of the curved sections of the curved holding portion 163 along the X direction can be formed at the center portions of this pair of the curved sections of the curved holding portion 163, or can be formed at points away from the center portions. The light emitting substrate engaging protrusions 164 are provided in the portions located in the perpendicular direction or Z direction from the luminance equalizer sheet engaging protrusions 165, respectively. The light emitting substrate engaging protrusions 164 formed on the pair of the side portions 162 along the X direction can be formed at the center portions of this pair of the side portions 162, or can be formed at points away from the center portions. The reflective sheet 12 is also provided with notches (not shown) that can share the light emitting substrate engaging protrusions 164 of the holding member 16 with the notches of the light emitting substrate 11, and is fixed to be positioned with respect to the light emitting element 111 of the light emitting substrate 11.

The display panel 2 is disposed on the optical sheet 15 of the light emitting device 1. The display panel 2 is fixed near the opening of the holding member 16. The display panel 2 is fixed to the holding member 16 using double-sided tape or other fixing means. The display panel 2 is a liquid crystal panel. The display panel 2 has a plurality of pixels, and displays an image by each of the pixels transmitting or absorbing light from the light emitting device 1 depending on the applied voltage. The display panel 2 has a curved shape that is convex toward the light emitting substrate 11. In the first embodiment, the luminance equalizer sheet 13, the diffusion member 14, the optical sheet 15 and the curved holding portion 163 of the holding member 16 are curved along the display panel 2.

Effect of First Embodiment

The following effects can be obtained with the first embodiment.

In the first embodiment, as described above, the luminance equalizer sheet 13, which has the linear expansion coefficient larger than the linear expansion coefficient of the light emitting substrate 11, has the curved shape, and the degree of curvature of the luminance equalizer sheet 13, which has the larger linear expansion coefficient, is larger than the degree of curvature of the light emitting substrate 11, which has the smaller linear expansion coefficient. By making the luminance equalizer sheet 13 with the larger linear expansion coefficient more curved, the positional shift amount of the luminance equalizer sheet 13 with the larger linear expansion coefficient relative to the light emitting substrate 11 with the smaller linear expansion coefficient can be reduced at a position away from the predetermined position. In other words, if the positional shift direction caused by the expansion of the light emitting substrate 11, which has the smaller linear expansion coefficient, is the reference direction, then the luminance equalizer sheet 13, which has the larger linear expansion coefficient, expands in the direction inclined to the reference direction due to the curvature. As a result, the expansion of the luminance equalizer sheet 13, which has the larger linear expansion coefficient, includes the orthogonal direction component in the direction orthogonal to the reference direction, in addition to the reference direction component corresponding to the positional shift. The positional shift (the reference direction component) can be reduced by the amount of this orthogonal direction component caused by the curvature. With this configuration, deterioration of luminance uniformity caused by temperature changes can be suppressed by reducing misalignment of the relative positional relationship of the light emitting substrate 11 and the luminance equalizer sheet 13 caused by temperature changes.

Here, referring to FIGS. 4A, 4B, 5A and 5B, the positional relationship between a light emitting substrate and a luminance equalizer sheet in a comparative example and this embodiment at room temperature and at high temperature. In FIGS. 4A, 4B, 5A and 5B, the light emitting substrate and the luminance equalizer sheet are fixed so as to be relatively positioned with each other via the holding member not shown in the drawings. FIGS. 4A and 4B show the comparative example pertaining to the configuration of a light emitting substrate 91 and a luminance equalizer sheet 93 in a light emitting device, and the light emitting substrate 91, which has a flat shape, and the luminance equalizer sheet 93, which has a larger linear expansion coefficient than the light emitting substrate 91 and has a flat shape, are arranged in parallel relative to each other. In the comparative example, as shown in FIG. 4A, at room temperature, a light emitting element 911 on the light emitting substrate 91 and a plurality of through holes 931 on the luminance equalizer sheet 93 corresponding to the light emitting element 911 are arranged relative to each other in correct positions as designed, and thus the light emitting device can be said to have high luminance uniformity. However, when the temperature changes from room temperature to high temperature, for example, the light emitting substrate 91 and the luminance equalizer sheet 93 expand. In this case, as shown in FIG. 4B, at a position away from a positioning position (or a fixed position), the amount of expansion of the luminance equalizer sheet 93 on which the plurality of through holes 931 corresponding to the light emitting elements 911 are disposed is larger than the amount of expansion of the light emitting substrate 91 on which the light emitting elements 911 corresponding to the plurality of through holes 931 are disposed. Since the light emitting elements 911 on the light emitting substrate 91 and the corresponding plurality of through holes 931 on the luminance equalizer sheet 93 are arranged in parallel to each other, the difference in the amount of expansion due to the difference in the linear expansion coefficients of the light emitting substrate 91 and the luminance equalizer sheet 931 directly becomes a relative positional shift, which results in a decrease in luminance uniformity.

In contrast, FIGS. 5A and 5B show an example of the configuration of the light emitting substrate 11 and the luminance equalizer sheet 13 in the light emitting device 1 according to the first embodiment, and the light emitting substrate 11 having a flat shape and the luminance equalizer sheet 13 having a larger linear expansion coefficient than the light emitting substrate 11 and having a curved shape are arranged opposite relative to each other. In the configuration of the first embodiment, as shown in FIG. 5A, at room temperature, the light emitting element 111 on the light emitting substrate 11 and the plurality of through holes 131 on the luminance equalizer sheet 13 corresponding to the light emitting element 111 can be arranged relative to each other in correct positions as designed, and the light emitting device 1 with high luminance uniformity can be realized. Furthermore, when the temperature changes from room temperature to high temperature and the light emitting substrate 11 and the luminance equalizer sheet 13 expand, as shown in FIG. 5B, at a position away from the positioning position, the amount of expansion of the luminance equalizer sheet 13 on which the plurality of through holes 131 corresponding to the light emitting elements 111 are disposed is larger than the amount of expansion of the light emitting substrate 11 on which the light emitting element 111 corresponding to the plurality of through holes 131 are disposed. However, the luminance equalizer sheet 13, which has a larger linear expansion coefficient, expands in a direction inclined to the reference direction due to curvature. As a result, the expansion of the one with the larger linear expansion coefficient (i.e., the luminance equalizer sheet 13 in the first embodiment) includes an orthogonal direction component in a direction orthogonal to the reference direction, in addition to the reference direction component corresponding to the positional shift. The positional shift (the reference direction component) can be reduced by the amount of this orthogonal direction component caused by the curvature. Therefore, it is possible to suppress misalignment of the relative positional relationship between each light emitting element 111 of the light emitting substrate 11 and each pattern of the through holes 131 of the luminance equalizer sheet 13 corresponding to each light emitting element 111 at a position away from the positioning position. As a result, the deterioration of luminance uniformity can be suppressed.

The farther away from the positioning position, the larger the positional shift amount due to expansion. In the first embodiment, as described above, the light emitting substrate 11 and the luminance equalizer sheet 13 are designed so that the luminance equalizer sheet 13 is curved such that the angle θ1 between the plane P1 of the light emitting substrate 11 and the tangent plane TP1 of the luminance equalizer sheet 13 in the perpendicular direction of the plane P1 of the light emitting substrate 11 increases as moving away from the positioning position. With this configuration, the amount of the orthogonal direction component generated can be increased as moving away from the predetermined position, and thus an amount of decrease in the reference direction component can be increased as moving away from the predetermined position. With this configuration, the deterioration of luminance uniformity caused by temperature changes can be further suppressed by further reducing misalignment of the relative positional relationship of the light emitting substrate 11 and the luminance equalizer sheet 13 caused by temperature changes.

In the first embodiment, as described above, the positioning position is the position where the plane orthogonal to the tangent plane of the luminance equalizer sheet 13, which has the larger linear expansion coefficient, overlaps the plane orthogonal to the plane of the light emitting substrate 11, which has the smaller linear expansion coefficient. With this configuration, since the light emitting substrate 11 having a flat shape and the luminance equalizer sheet 13 having a curved shape can be stably fixed at the positioning position, the assemblability of the luminance equalizer sheet 13 can be improved.

In the first embodiment, as described above, the luminance equalizer sheet 13 has a curved shape, and the diffusion member 14 is further comprised that is disposed on the opposite side of the luminance equalizer sheet 13 from the light emitting substrate 11 and has a curved shape corresponding to the curved shape of the luminance equalizer sheet 13. With this configuration, the degree of curvature of the luminance equalizer sheet 13, which has the curved shape, can be appropriately maintained. Therefore, the deterioration of luminance uniformity caused by temperature changes can be suppressed.

In the first embodiment, as described above, the optical sheet 15 is further comprised that is disposed on the opposite side of the diffusion member 14 from the luminance equalizer sheet 13 and has a curved shape corresponding to the curved shape of the luminance equalizer sheet 13. With this configuration, the degree of curvature of the luminance equalizer sheet 13, which has the curved shape, can be more appropriately maintained. Therefore, the deterioration of luminance uniformity caused by temperature changes can be suppressed.

In the first embodiment, as described above, the luminance equalizer sheet 13 has a curved shape, the holding member 16 is further comprised that holds the light emitting substrate 11 and the luminance equalizer sheet 13, and the holding member 16 has the curved holding portion 163 having a curved shape for holding the curvature of the luminance equalizer sheet 13. With this configuration, the luminance equalizer sheet 13 with the desired curved shape can be configured simply by placing the luminance equalizer sheet 13 formed by a flexible sheet on the curved holding portion 163.

Second Embodiment

Figure 6:
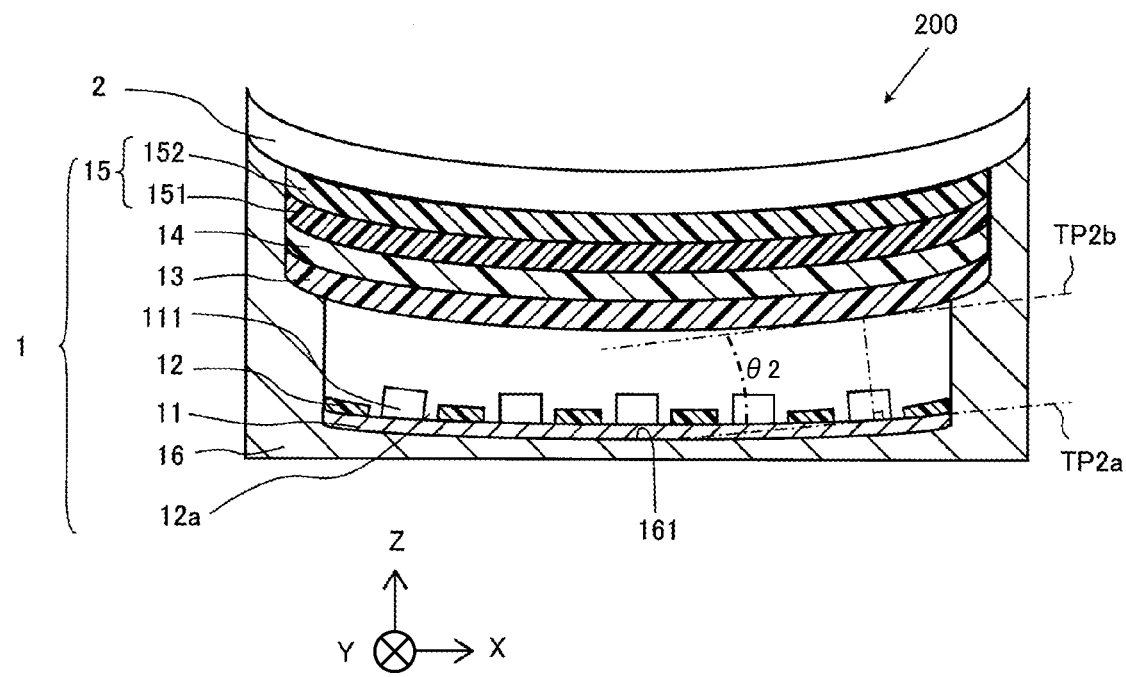
FIG. 6 is a cross-sectional view of a display device in accordance with a second embodiment.

Referring to FIG. 6, the configuration of a display device 200 according to a second embodiment will be explained. In view of the similarity between the first and second embodiments, the parts of the second embodiment that are similar or identical to the parts of the first embodiment will be given the same reference numerals as the parts of the first embodiment. Moreover, the descriptions of the parts of the second embodiment that are similar or identical to the parts of the first embodiment may be omitted for the sake of brevity.

In the second embodiment, unlike the first embodiment, the light emitting substrate 11 and the luminance equalizer sheet 13 each have a curved shape. Specifically, in the illustrated embodiment, the light emitting substrate 11 and the luminance equalizer sheet 13 each have a single curved shape. In particular, in the illustrated embodiment, the luminance equalizer sheet 13, which has a linear expansion coefficient larger than a linear expansion coefficient of the light emitting substrate 11, has a curved shape that is convex toward the light emitting substrate 11, the light emitting substrate 11 has a curved shape that is concave away from the luminance equalizer sheet 13, and the degree of curvature of the luminance equalizer sheet 13 is configured to be larger than the degree of curvature of the light emitting substrate 11. The bottom portion 161 of the holding member 16 has a curved shape that is concave away from the light emitting substrate 11 in the cross section of the display device 200 taken along the X direction. The light emitting substrate 11 and the luminance equalizer sheet 13 are curved with respect to each other so that an angle θ2 between a tangent plane TP2a of the light emitting substrate 11 and a tangent plane TP2b of the luminance equalizer sheet 13 in the perpendicular direction of the tangent plane TP2a of the light emitting substrate 11 increases as moving away from the positioning position. Specifically, the light emitting substrate 11 and the luminance equalizer sheet 13 are curved with respect to each other so that the angle θ2 between the tangent plane TP2a of the light emitting substrate 11 at a position of the light emitting substrate 11 and the tangent plane TP2b of the luminance equalizer sheet 13 at a position of the luminance equalizer sheet 13 located in the perpendicular direction of the tangent plane TP2a of the light emitting substrate 11 relative to the position of the light emitting substrate 11 increases as the position of the light emitting substrate 11 moving away from the positioning position. More specifically, in the illustrated embodiment, the angle θ2 monotonically increases as moving outward in the X direction relative to a longitudinal center plane of the display device 200 that is a YZ plane and extends through the positioning positions or notches of the light emitting substrate 11 and the luminance equalizer sheet 13.

The other configuration of the second embodiment is the same as the first embodiment above.

Effect of Second Embodiment

In the second embodiment, as described above, the luminance equalizer sheet 13, which has the linear expansion coefficient larger than the linear expansion coefficient of the light emitting substrate 11, has a curved shape that is convex toward the light emitting substrate 11, the light emitting substrate 11 has a curved shape that is concave away from the luminance equalizer sheet 13, and the degree of curvature of the luminance equalizer sheet 13 is configured to be larger than the degree of curvature of the light emitting substrate 11. With this configuration, as in the first embodiment above, deterioration of luminance uniformity caused by temperature changes can be suppressed by reducing misalignment of the relative positional relationship of the light emitting substrate 11 and the luminance equalizer sheet 13 caused by temperature changes.

If the light emitting substrate 11 having the curved shape expands and contracts along the bottom portion 161 of the holding member 16 due to temperature changes, the direction of the light emitting elements 111 will change. However, for example, if the curvature amount of the light emitting substrate 11 is about R800 mm to R3000 mm, the shift amount due to expansion and contraction is less than 1 mm. Therefore, the amount of change in the direction of the light emitting elements 111 is very small and the angular distribution of the light intensity hardly changes. Therefore, even if the light emitting substrate 11 has a curved shape, the effect of changing the direction of the light emitting elements 111 can be ignored.

The other effects of the second embodiment are the same as the first embodiment.

Third Embodiment

Figure 7:
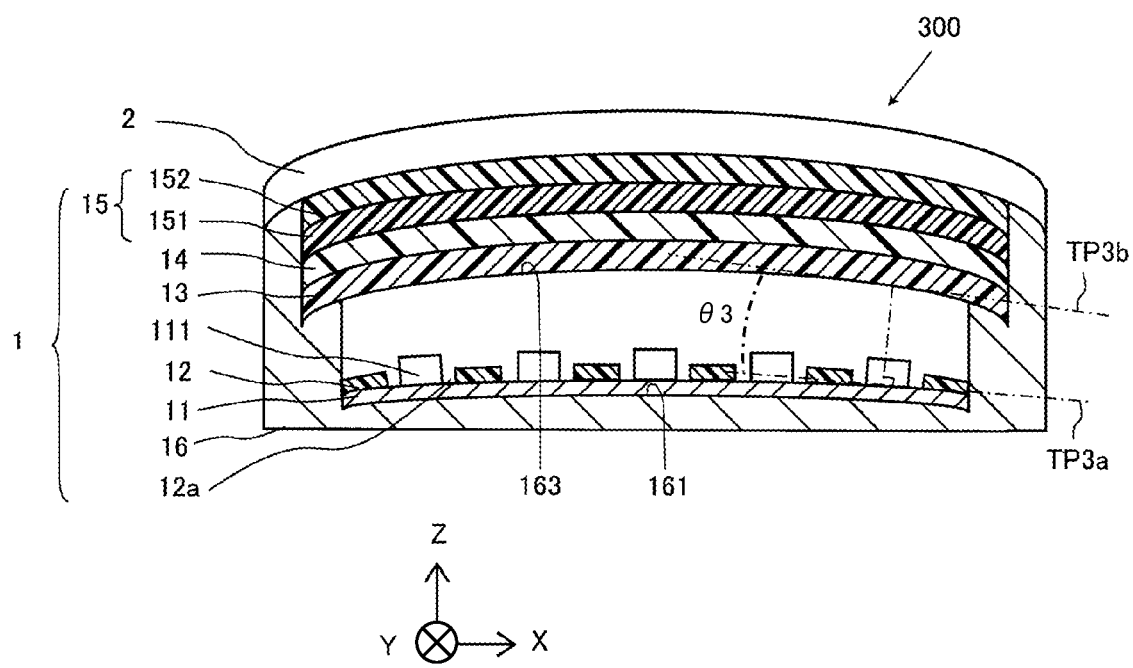
FIG. 7 is a cross-sectional view of a display device in accordance with a third embodiment.

Referring to FIG. 7, the configuration of a display device 300 according to a third embodiment will be explained. In view of the similarity between the first and third embodiments, the parts of the third embodiment that are similar or identical to the parts of the first embodiment will be given the same reference numerals as the parts of the first embodiment. Moreover, the descriptions of the parts of the third embodiment that are similar or identical to the parts of the first embodiment may be omitted for the sake of brevity.

In the third embodiment, unlike the first embodiment, the light emitting substrate 11 and the luminance equalizer sheet 13 each have a curved shape. Specifically, in the illustrated embodiment, the light emitting substrate 11 and the luminance equalizer sheet 13 each have a single curved shape. In particular, in the illustrated embodiment, the luminance equalizer sheet 13, which has a linear expansion coefficient larger than a linear expansion coefficient of the light emitting substrate 11, has a curved shape that is concave away from the light emitting substrate 11, the light emitting substrate 11 has a curved shape that is convex toward the luminance equalizer sheet 13, and the degree of curvature of the luminance equalizer sheet 13 is configured to be larger than the degree of curvature of the light emitting substrate 11. The bottom portion 161 of the holding member 16 has a curved shape that is convex toward the light emitting substrate 11 in the cross section of the display device 300 taken along the X direction. The diffusion member 14, the optical sheet 15, the curved holding portion 163 along the X direction of the holding member 16, and the display panel 2 are curved along the luminance equalizer sheet 13 in the cross section of the display device 300 taken along the X direction. The light emitting substrate 11 and the luminance equalizer sheet 13 are curved with respect to each other so that an angle θ3 between a tangent plane TP3a of the light emitting substrate 11 and a tangent plane TP3b of the luminance equalizer sheet 13 in the perpendicular direction of the tangent plane TP3a of the light emitting substrate 11 increases as moving away from the positioning position. Specifically, the light emitting substrate 11 and the luminance equalizer sheet 13 are curved with respect to each other so that the angle θ3 between the tangent plane TP3a of the light emitting substrate 11 at a position of the light emitting substrate 11 and the tangent plane TP3b of the luminance equalizer sheet 13 at a position of the luminance equalizer sheet 13 located in the perpendicular direction of the tangent plane TP3a of the light emitting substrate 11 relative to the position of the light emitting substrate 11 increases as the position of the light emitting substrate 11 moving away from the positioning position. More specifically, in the illustrated embodiment, the angle θ3 monotonically increases as moving outward in the X direction relative to a longitudinal center plane of the display device 300 that is a YZ plane and extends through the positioning positions or notches of the light emitting substrate 11 and the luminance equalizer sheet 13.

The other configuration of the third embodiment is the same as the first embodiment above.

Effect of Third Embodiment

In the third embodiment, as described above, the luminance equalizer sheet 13, which has the linear expansion coefficient larger than the linear expansion coefficient of the light emitting substrate 11, has a curved shape that is concave away from the light emitting substrate 11, the light emitting substrate 11 has a curved shape that is convex toward the luminance equalizer sheet 13, and the degree of curvature of the luminance equalizer sheet 13 is configured to be larger than the degree of curvature of the light emitting substrate 11. With this configuration, as in the first embodiment above, deterioration of luminance uniformity caused by temperature changes can be suppressed by reducing misalignment of the relative positional relationship of the light emitting substrate 11 and the luminance equalizer sheet 13 caused by temperature changes.

The other effects of the third embodiment are the same as the first embodiment.

In the third embodiment, alternatively, the luminance equalizer sheet 13, which has the linear expansion coefficient larger than the linear expansion coefficient of the light emitting substrate 11, can have the curved shape that is concave away from the light emitting substrate 11, the light emitting substrate 11 can have a flat shape or a curved shape that is concave away from the luminance equalizer sheet 13, and the degree of curvature of the luminance equalizer sheet 13 can be larger than the degree of curvature of the light emitting substrate 11.

Fourth Embodiment

Figure 8:
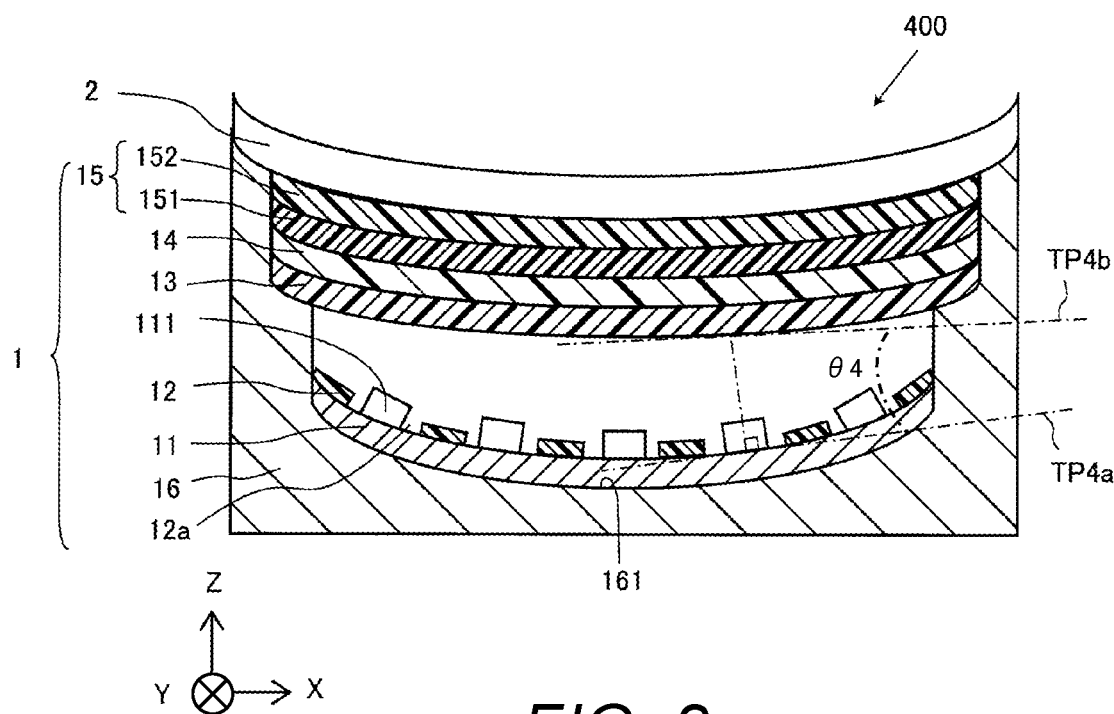
FIG. 8 is a cross-sectional view of a display device in accordance with a fourth embodiment.

Referring to FIG. 8, the configuration of a display device 400 according to a fourth embodiment will be explained. In view of the similarity between the first and fourth embodiments, the parts of the fourth embodiment that are similar or identical to the parts of the first embodiment will be given the same reference numerals as the parts of the first embodiment. Moreover, the descriptions of the parts of the fourth embodiment that are similar or identical to the parts of the first embodiment may be omitted for the sake of brevity.

In the fourth embodiment, unlike the first embodiment, the light emitting substrate 11 and the luminance equalizer sheet 13 each have a curved shape. Specifically, in the illustrated embodiment, the light emitting substrate 11 and the luminance equalizer sheet 13 each have a single curved shape. In particular, in the illustrated embodiment, the luminance equalizer sheet 13, which has a linear expansion coefficient smaller than a linear expansion coefficient of the light emitting substrate 11, has a curved shape that is convex toward the light emitting substrate 11, the light emitting substrate 11 has a curved shape that is concave away from the luminance equalizer sheet 13, and the degree of curvature of the luminance equalizer sheet 13 is configured to be smaller than the degree of curvature of the light emitting substrate 11. The bottom portion 161 of the holding member 16 has a curved shape that is concave away from the light emitting substrate 11 in the cross section of the display device 400 taken along the X direction. The light emitting substrate 11 and the luminance equalizer sheet 13 are curved with respect to each other so that an angle θ4 between a tangent plane TP4a of the light emitting substrate 11 and a tangent plane TP4b of the luminance equalizer sheet 13 in the perpendicular direction of the tangent plane TP4a of the light emitting substrate 11 increases as moving away from the positioning position. Specifically, the light emitting substrate 11 and the luminance equalizer sheet 13 are curved with respect to each other so that the angle θ4 between the tangent plane TP4a of the light emitting substrate 11 at a position of the light emitting substrate 11 and the tangent plane TP4b of the luminance equalizer sheet 13 at a position of the luminance equalizer sheet 13 located in the perpendicular direction of the tangent plane TP4a of the light emitting substrate 11 relative to the position of the light emitting substrate 11 increases as the position of the light emitting substrate 11 moving away from the positioning position. More specifically, in the illustrated embodiment, the angle θ4 monotonically increases as moving outward in the X direction relative to a longitudinal center plane of the display device 400 that is a YZ plane and extends through the positioning positions or notches of the light emitting substrate 11 and the luminance equalizer sheet 13. In this embodiment, the materials of the luminance equalizer sheet 13 and the light emitting substrate 11 are not particularly limited as long as the linear expansion coefficient of the luminance equalizer sheet 13 is smaller than the linear expansion coefficient of the light emitting substrate 11.

The other configurations of the fourth embodiment are the same as the first embodiment above.

Effect of Fourth Embodiment

In the fourth embodiment, as described above, the luminance equalizer sheet 13, which has the linear expansion coefficient smaller than the linear expansion coefficient of the light emitting substrate 11, has a curved shape that is convex toward the light emitting substrate 11, the light emitting substrate 11 has a curved shape that is concave away from the luminance equalizer sheet 13, and the degree of curvature of the luminance equalizer sheet 13 is configured to be smaller than the degree of curvature of the light emitting substrate 11. With this configuration, as in the first embodiment above, deterioration of luminance uniformity caused by temperature changes can be suppressed by reducing misalignment of the relative positional relationship of the light emitting substrate 11 and the luminance equalizer sheet 13 caused by temperature changes.

The other effects of the fourth embodiment are the same as those of the first embodiment.

In the fourth embodiment, alternatively, the luminance equalizer sheet 13, which has the linear expansion coefficient smaller than the linear expansion coefficient of the light emitting substrate 11, can have the curved shape that is convex toward the light emitting substrate 11, the light emitting substrate 11 can have a curved shape that is convex toward the luminance equalizer sheet 13, and the degree of curvature of the luminance equalizer sheet 13 can be smaller than the degree of curvature of the light emitting substrate 11.

Fifth Embodiment

Figure 9:
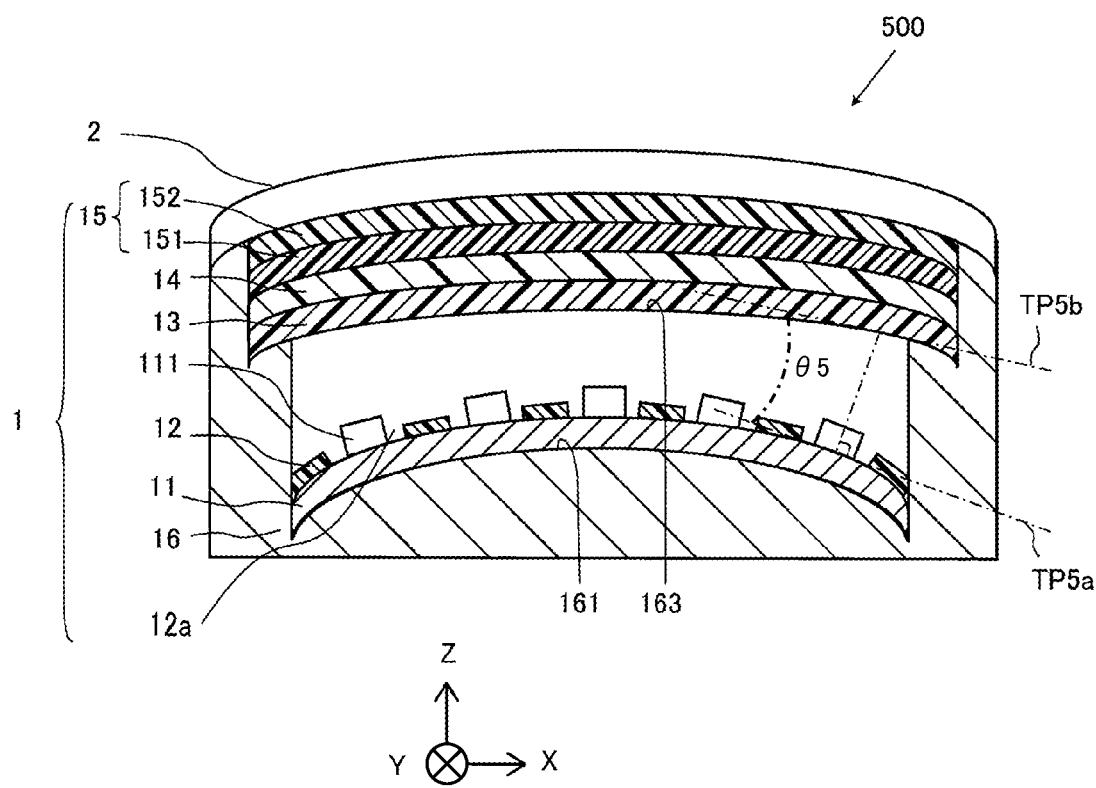
FIG. 9 is a cross-sectional view of a display device in accordance with a fifth embodiment.

Referring to FIG. 9, the configuration of a display device 500 according to a fifth embodiment will be explained. In view of the similarity between the first and fifth embodiments, the parts of the fifth embodiment that are similar or identical to the parts of the first embodiment will be given the same reference numerals as the parts of the first embodiment. Moreover, the descriptions of the parts of the fifth embodiment that are similar or identical to the parts of the first embodiment may be omitted for the sake of brevity.

In the fifth embodiment, unlike the first embodiment, the light emitting substrate 11 and the luminance equalizer sheet 13 each have a curved shape. Specifically, in the illustrated embodiment, the light emitting substrate 11 and the luminance equalizer sheet 13 each have a single curved shape. In particular, in the illustrated embodiment, the luminance equalizer sheet 13, which has a linear expansion coefficient smaller than a linear expansion coefficient of the light emitting substrate 11, has a curved shape that is concave away from the light emitting substrate 11, the light emitting substrate 11 has a curved shape that is convex toward the luminance equalizer sheet 13, and the degree of curvature of the luminance equalizer sheet 13 is configured to be smaller than the degree of curvature of the light emitting substrate 11. The bottom portion 161 of the holding member 16 has a curved shape that is convex toward the light emitting substrate 11 in the cross section of the display device 500 taken along the X direction. The diffusion member 14, the optical sheet 15, the curved holding portion 163 along the X direction of the holding member 16, and the display panel 2 are curved along the luminance equalizer sheet 13 in the cross section of the display device 500 taken along the X direction. The light emitting substrate 11 and the luminance equalizer sheet 13 are designed so that the light emitting substrate 11 is curved so that an angle $\theta 5$ between a tangent plane TP5$a$ of the light emitting substrate 11 and a tangent plane TP5$b$ of the luminance equalizer sheet 13 in the perpendicular direction of the tangent plane TP5$a$ of the light emitting substrate 11 increases as moving away from the positioning position. Specifically, the light emitting substrate 11 and the luminance equalizer sheet 13 are curved with respect to each other so that the angle $\theta 5$ between the tangent plane TP5$a$ of the light emitting substrate 11 at a position of the light emitting substrate 11 and the tangent plane TP5$b$ of the luminance equalizer sheet 13 at a position of the luminance equalizer sheet 13 located in the perpendicular direction of the tangent plane TP5$a$ of the light emitting substrate 11 relative to the position of the light emitting substrate 11 increases as the position of the light emitting substrate 11 moving away from the positioning position. More specifically, in the illustrated embodiment, the angle $\theta 5$ monotonically increases as moving outward in the X direction relative to a longitudinal center plane of the display device 500 that is a YZ plane and extends through the positioning positions or notches of the light emitting substrate 11 and the luminance equalizer sheet 13. In this embodiment, the materials of the luminance equalizer sheet 13 and the light emitting substrate 11 are not particularly limited as long as the linear expansion coefficient of the luminance equalizer sheet 13 is smaller than the linear expansion coefficient of the light emitting substrate 11.

The other configuration of the fifth embodiment is the same as the first embodiment above.

Effect of Fifth Embodiment

In the fifth embodiment, as described above, the luminance equalizer sheet 13, which has the linear expansion coefficient smaller than the linear expansion coefficient of the light emitting substrate 11, has a curved shape that is concave away from the light emitting substrate 11, the light emitting substrate 11 has a curved shape that is convex toward the luminance equalizer sheet 13, and the degree of curvature of the luminance equalizer sheet 13 is configured to be smaller than the degree of curvature of the light emitting substrate 11. With this configuration, as in the first embodiment above, deterioration of luminance uniformity caused by temperature changes can be suppressed by reducing misalignment of the relative positional relationship of the light emitting substrate 11 and the luminance equalizer sheet 13 caused by temperature changes.

The other effects of the fifth embodiment are the same as those of the first embodiment.

In the fifth embodiment, alternatively, the luminance equalizer sheet 13, which has the linear expansion coefficient smaller than the linear expansion coefficient of the light emitting substrate 11, can have the curved shape that is concave away from the light emitting substrate 11, the light emitting substrate 11 can have a curved shape that is concave away from the luminance equalizer sheet 13, and the degree of curvature of the luminance equalizer sheet 13 can be smaller than the degree of curvature of the light emitting substrate 11.

Sixth Embodiment

Figure 10:
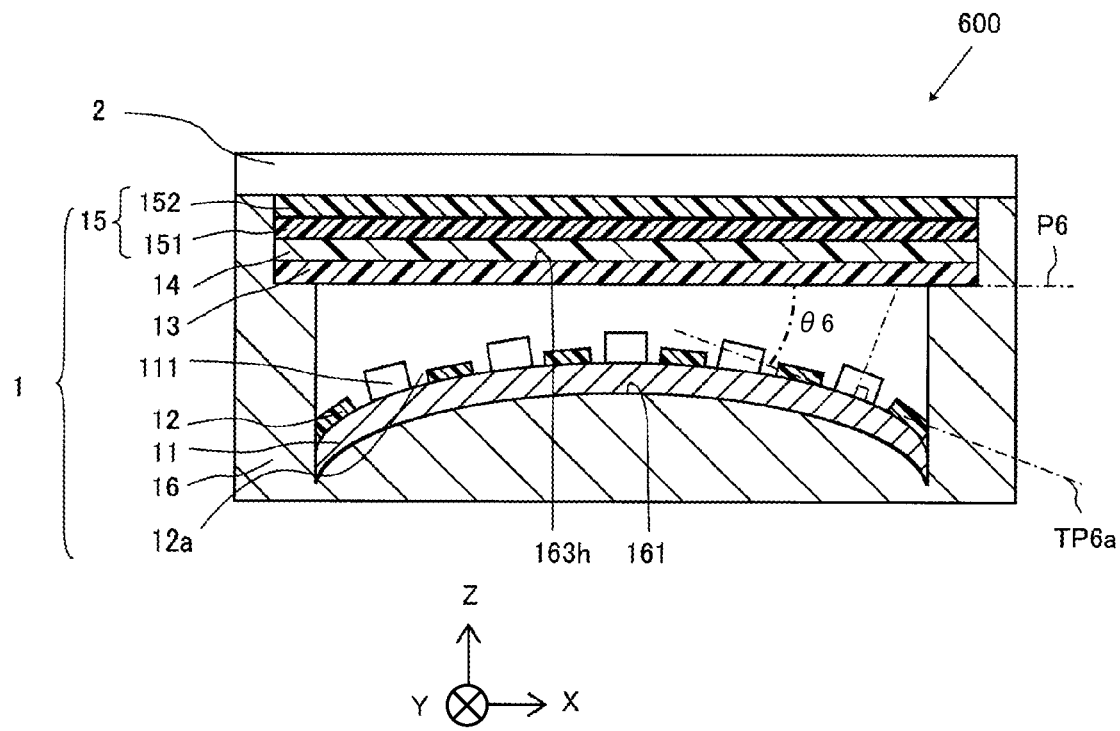
FIG. 10 is a cross-sectional view of a display device in accordance with a sixth embodiment.

Referring to FIG. 10, the configuration of a display device 600 according to a sixth embodiment will be explained. In view of the similarity between the first and sixth embodiments, the parts of the sixth embodiment that are similar or identical to the parts of the first embodiment will be given the same reference numerals as the parts of the first embodiment. Moreover, the descriptions of the parts of the sixth embodiment that are similar or identical to the parts of the first embodiment may be omitted for the sake of brevity.

In the sixth embodiment, unlike the first embodiment, the light emitting substrate 11 has a curved shape, while the luminance equalizer sheet 13 has a flat shape. Specifically, in the illustrated embodiment, the light emitting substrate 11 has a single curved shape. In particular, in the illustrated embodiment, the luminance equalizer sheet 13, which has a linear expansion coefficient smaller than a linear expansion coefficient of the light emitting substrate 11, has a flat shape, the light emitting substrate 11 has a curved shape that is convex toward the luminance equalizer sheet 13, and the degree of curvature of the luminance equalizer sheet 13 is configured to be smaller than the degree of curvature of the light emitting substrate 11. The bottom portion 161 of the holding member 16 has a curved shape that is convex toward the light emitting substrate 11 in the cross section of the display device 600 taken along the X direction. The diffusion member 14, the optical sheet 15, a holding portion 163h of the holding member 16, and the display panel 2 have a flat shape in the cross section of the display device 600 taken along the X direction. The light emitting substrate 11 and the luminance equalizer sheet 13 are designed so that the light emitting substrate 11 is curved such that an angle θ6 between a tangent plane TP6a of the light emitting substrate 11 and a plane P6 of the luminance equalizer sheet 13 in the perpendicular direction of the tangent plane TP6a of the light emitting substrate 11 increases as moving away from the positioning position. Specifically, the light emitting substrate 11 is curved with respect to the luminance equalizer sheet 13 so that the angle θ6 between the tangent plane TP6a of the light emitting substrate 11 at a position of the light emitting substrate 11 and the tangent plane TP6b of the luminance equalizer sheet 13 at a position of the luminance equalizer sheet 13 located in the perpendicular direction of the tangent plane TP6a of the light emitting substrate 11 relative to the position of the light emitting substrate 11 increases as the position of the light emitting substrate 11 moving away from the positioning position. More specifically, in the illustrated embodiment, the angle θ6 monotonically increases as moving outward in the X direction relative to a longitudinal center plane of the display device 600 that is a YZ plane and extends through the positioning positions or notches of the light emitting substrate 11 and the luminance equalizer sheet 13. In this embodiment, the materials of the luminance equalizer sheet 13 and the light emitting substrate 11 are not particularly limited as long as the linear expansion coefficient of the luminance equalizer sheet 13 is smaller than the linear expansion coefficient of the light emitting substrate 11.

Also, in the sixth embodiment above, unlike the first embodiment above which includes the curved holding portion 163 having the curved holding portion 163 that is formed in a curved shape at the side portions 162 along the X direction and is formed in a flat shape at the side portions 162 along the Y direction, since the luminance equalizer sheet 13 has a flat shape, the holding member 16 includes the holding portion 163h that is formed in a flat shape at all side portions 162 along the X direction and the Y direction. The holding portion 163h is similar to the curved holding portion 163 in the first embodiment in its configuration other than its shape.

The other configurations of the sixth embodiment are the same as the first embodiment above.

Effect of Sixth Embodiment

In the sixth embodiment, as described above, the luminance equalizer sheet 13, which has the linear expansion coefficient smaller than the linear expansion coefficient of the light emitting substrate 11, has a flat shape, the light emitting substrate 11 has a curved shape that is convex toward the luminance equalizer sheet 13, and the degree of curvature of the luminance equalizer sheet 13 is configured to be smaller than the degree of curvature of the light emitting substrate 11. With this configuration, as in the first embodiment above, deterioration of luminance uniformity caused by temperature changes can be suppressed by reducing misalignment of the relative positional relationship of the light emitting substrate 11 and the luminance equalizer sheet 13 caused by temperature changes.

Other effects of the sixth embodiment are the same as those of the first embodiment.

In the sixth embodiment, alternatively, the luminance equalizer sheet 13, which has the linear expansion coefficient smaller than the linear expansion coefficient of the light emitting substrate 11, can have a flat shape, and the light emitting substrate 11 can have a curved shape that is concave away from the luminance equalizer sheet 13.

Seventh Embodiment

Figure 11:
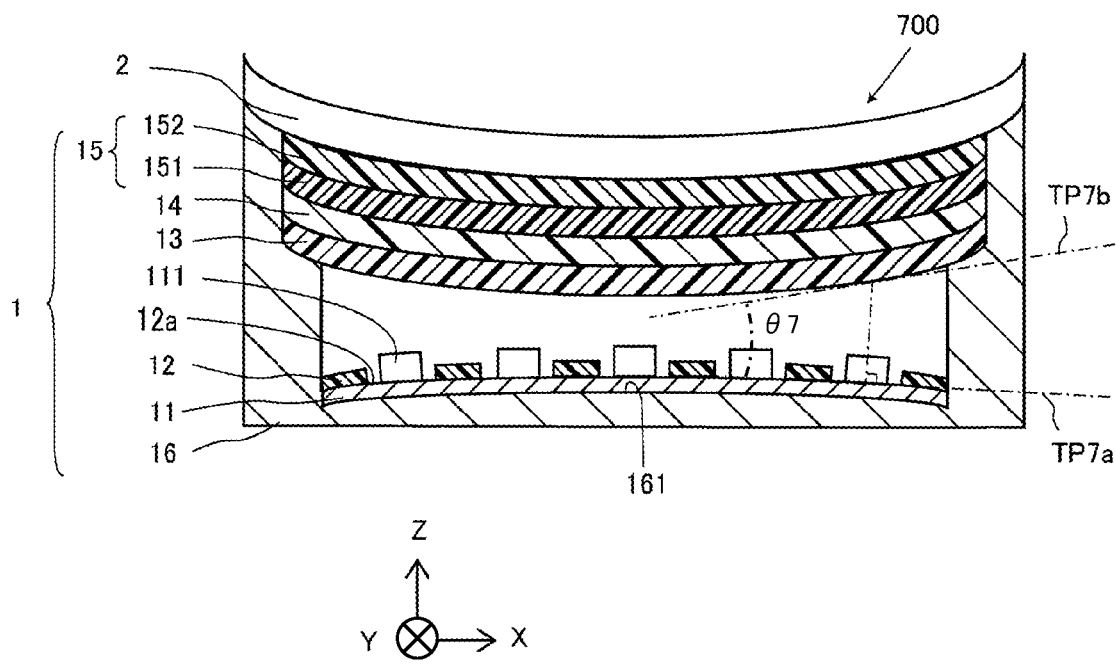
FIG. 11 is a cross-sectional view of a display device in accordance with a seventh embodiment.

Referring to FIG. 11, the configuration of a display device 700 according to a seventh embodiment will be explained. In view of the similarity between the first and seventh embodiments, the parts of the seventh embodiment that are similar or identical to the parts of the first embodiment will be given the same reference numerals as the parts of the first embodiment. Moreover, the descriptions of the parts of the seventh embodiment that are similar or identical to the parts of the first embodiment may be omitted for the sake of brevity.

In the seventh embodiment, unlike the first embodiment, the light emitting substrate 11 and the luminance equalizer sheet 13 each have a curved shape. Specifically, in the illustrated embodiment, the light emitting substrate 11 and the luminance equalizer sheet 13 each have a single curved shape. In particular, in the illustrated embodiment, the luminance equalizer sheet 13, which has a linear expansion coefficient larger than a linear expansion coefficient of the light emitting substrate 11, has a curved shape that is convex toward the light emitting substrate 11, the light emitting substrate 11 has a curved shape that is convex toward the luminance equalizer sheet 13, and the degree of curvature of the luminance equalizer sheet 13 is configured to be larger than the degree of curvature of the light emitting substrate 11. The bottom portion 161 of the holding member 16 has a curved shape that is convex toward the light emitting substrate 11 in the cross section of the display device 700 taken along the X direction. The light emitting substrate 11 and the luminance equalizer sheet 13 are curved with respect to each other such that an angle θ7 between a tangent plane TP7a of the light emitting substrate 11 and a tangent plane TP7b of the luminance equalizer sheet 13 in the perpendicular direction of the tangent plane TP7a of the light emitting substrate 11 increases as moving away from the positioning position. Specifically, the light emitting substrate 11 and the luminance equalizer sheet 13 are curved so that the angle θ7 between the tangent plane TP7a of the light emitting substrate 11 at a position of the light emitting substrate 11 and the tangent plane TP7b of the luminance equalizer sheet 13 at a position of the luminance equalizer sheet 13 located in the perpendicular direction of the tangent plane TP7a of the light emitting substrate 11 relative to the position of the light emitting substrate 11 increases as the position of the light emitting substrate 11 moving away from the positioning position. More specifically, in the illustrated embodiment, the angle θ7 monotonically increases as moving outward in the X direction relative to a longitudinal center plane of the display device 700 that is a YZ plane and extends through the positioning positions or notches of the light emitting substrate 11 and the luminance equalizer sheet 13.

The other configurations of the seventh embodiment are the same as the first embodiment above.

Effect of Seventh Embodiment

In the seventh embodiment, as described above, the luminance equalizer sheet 13, which has the linear expansion coefficient larger than the linear expansion coefficient of the light emitting substrate 11, has a curved shape that is convex toward the light emitting substrate 11, the light emitting substrate 11 has a curved shape that is convex toward the luminance equalizer sheet 13, and the degree of curvature of the luminance equalizer sheet 13 is configured to be larger than the degree of curvature of the light emitting substrate 11. With this configuration, as in the first embodiment above, deterioration of luminance uniformity caused by temperature changes can be suppressed by reducing misalignment of the relative positional relationship of the light emitting substrate 11 and the luminance equalizer sheet 13 caused by temperature changes.

The other effects of the seventh embodiment are the same as those of the first embodiment.

Eighth Embodiment

Figure 12:
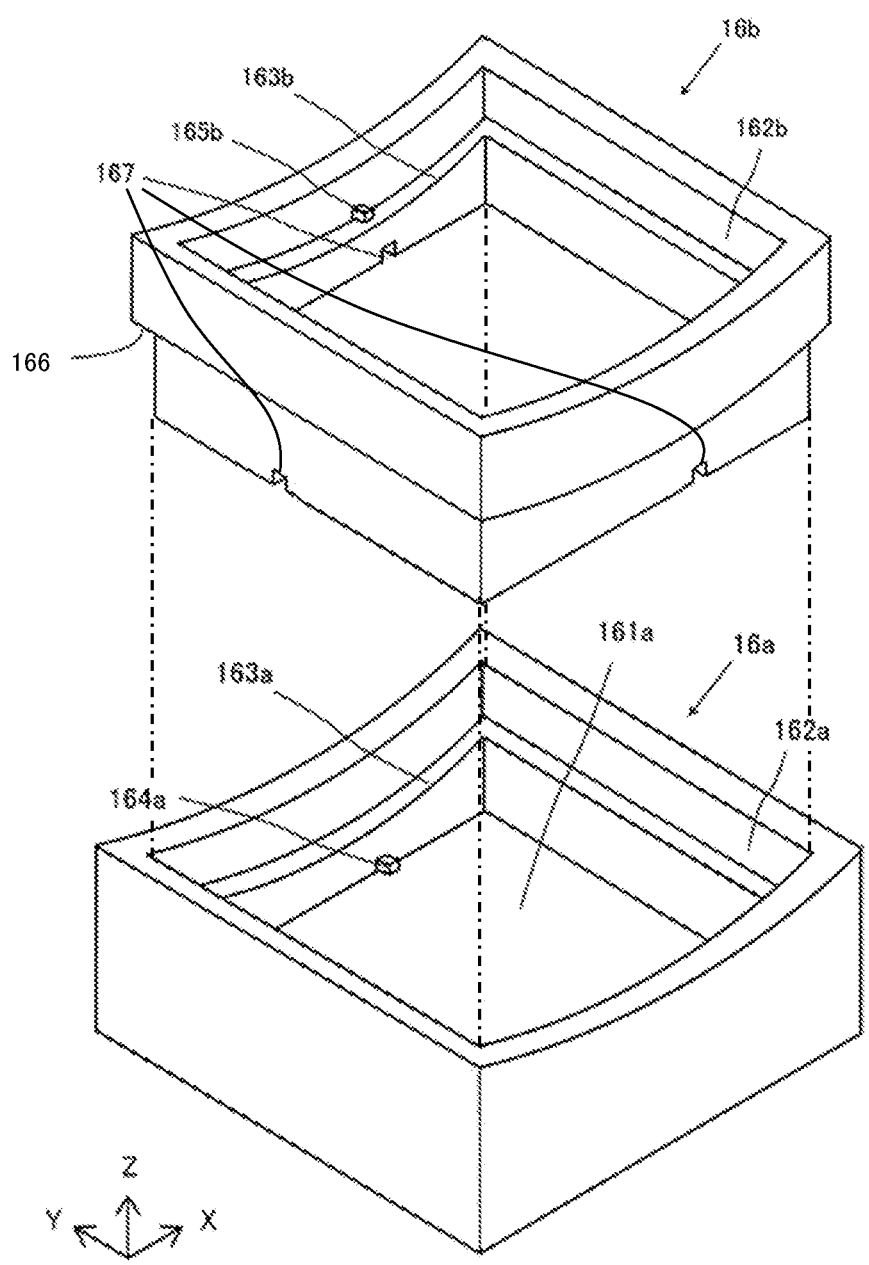
FIG. 12 is an exploded perspective view of a first holding member and a second holding member of a display device in accordance with an eighth embodiment.

Referring to FIG. 12, the configuration of a display device according to an eighth embodiment will be explained. In view of the similarity between the first and eighth embodiments, the parts of the eighth embodiment that are similar or identical to the parts of the first embodiment will be given the same reference numerals as the parts of the first embodiment. Moreover, the descriptions of the parts of the eighth embodiment that are similar or identical to the parts of the first embodiment may be omitted for the sake of brevity.

In the eighth embodiment, unlike the first embodiment, the holding member 16 is configured to include a first holding member 16a and a second holding member 16b that is provided on an inner peripheral surface side of the first holding member 16a. In other words, the holding member 16 of the first embodiment is integrally formed as a one-piece, unitary member, for example, while the holding member 16 of the eighth embodiment includes the first and second holding members 16a and 16b that are independently formed as separate members.

Figure 13:
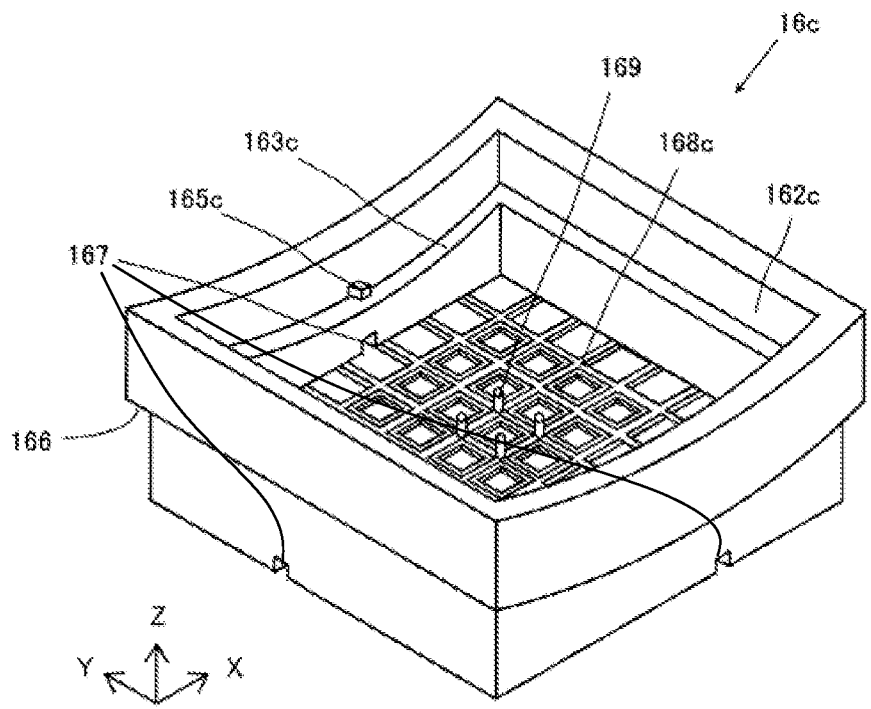
FIG. 13 is a perspective view of a second holding member in accordance with a ninth embodiment.

The first holding member 16a in the eighth embodiment has the same configuration as the holding member 16 of the first embodiment, except that the luminance equalizer sheet engaging protrusions 165 are not provided. The first holding member 16a is a box shape with an opening on the front surface side and has a bottom portion 161a and four side portions 162a. The side portions 162a have a first curved holding portion 163a and a plurality of (only one is shown in FIG. 13) light emitting substrate engaging protrusions 164a. The first curved holding portion 163a holds a recess portion 166 of the second holding member 16b, described later. The first curved holding portion 163a forms a step that protrudes inward on the side portions 162a. The light emitting substrate engaging protrusions 164a position and fix the light emitting substrate 11 as in the first embodiment, and also engage with notches 167 of the second holding member 16b, described later, to position and fix the second holding member 16b.

The second holding member 16b has a tubular shape with openings on the front surface side and the rear surface side, and has four side portions 162b. The second holding member 16b is provided on the inner peripheral surface side of the first holding member 16a. The second holding member 16b has a second curved holding portion 163b protruding inward on the side portions 162b. The second curved holding portion 163b forms a step that supports the periphery of the luminance equalizer sheet 13 and holds the curved shape of the luminance equalizer sheet 13, similar to the curved holding portion 163 of the first embodiment. The second curved holding portion 163b has a plurality of notches 167 that engage with the light emitting substrate engaging protrusions 164a of the first holding member 16a, respectively, and a plurality of (only one is shown in FIG. 13) luminance equalizer sheet engaging protrusions 165b that engage with the notches of the luminance equalizer sheet 13, respectively. The recess portion 166 is formed on the outer peripheral side of the second holding member 16b corresponding to the second curved holding portion 163b, and the recess portion 166 is held in contact with the first curved holding portion 163a. The second holding member 16b is made of a material with a higher reflectivity than the first holding member 16a, such as a white resin.

The other configurations of the eighth embodiment are the same as the first embodiment above.

Effect of Eighth Embodiment

In the eighth embodiment, as described above, the holding member 16 includes the first holding member 16a and the second holding member 16b that is provided on the inner peripheral surface side of the first holding member 16a and is made of a material with a higher reflectivity than the first holding member 16a. With this configuration, the light utilization efficiency can be improved by reflecting the light on the side portions 162b of the second holding member 16b, and thus the luminance of the light emitting device 1 can be improved.

The other effects of the eighth embodiment are the same as those of the first embodiment.

Ninth Embodiment

Figure 14:
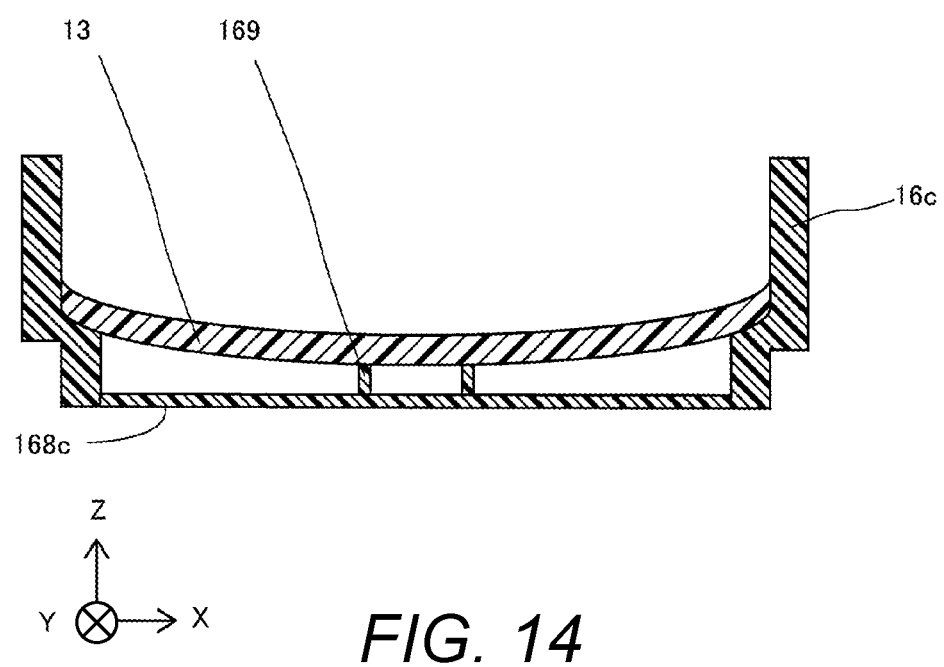
FIG. 14 is a cross-sectional view of the second holding member in accordance with the ninth embodiment.

Referring to FIGS. 13 and 14, the configuration of a display device according to a ninth embodiment will be explained. In view of the similarity between the first and ninth embodiments, the parts of the ninth embodiment that are similar or identical to the parts of the first embodiment will be given the same reference numerals as the parts of the first embodiment. Moreover, the descriptions of the parts of the ninth embodiment that are similar or identical to the parts of the first embodiment may be omitted for the sake of brevity.

In the ninth embodiment, unlike the eighth embodiment, the holding member 16 includes the first holding member 16a and a second holding member 16c that is provided on an inner peripheral surface side of the first holding member 16a. The second holding member 16c of the ninth embodiment is identical to the second holding member 16b of the eighth embodiment, expect that a grid-shaped planar member 168c is provided in the opening of the second holding member 16c on the light emitting substrate 11 side. At the intersections of this grid, a plurality of columnar members 169 are formed that contact a surface of the luminance equalizer sheet 13 on the light emitting substrate 11 side. The grid-shaped planar member 168c is formed so that the light emitting elements 111 on the light emitting substrate 11 are disposed in gap portions of the grid, respectively. In this embodiment, one columnar member 169 is formed in each of four central intersections of the plurality of the intersections of the grid, but the location and number of columnar members 169 are not particularly limited. In the illustrated embodiment, the grid-shaped planar member 168c has a dimension (or height) in the Z direction that is smaller than a dimension (or height) of the light emitting elements 111 in the Z direction and is smaller than a distance between the surface of the luminance equalizer sheet 13 on the light emitting substrate 11 side and a light reflection side surface of the reflective sheet 12. However, the grid-shaped planar member 168c can have a dimension (or height) in the Z direction that is larger than a dimension (or height) of the light emitting elements 111 in the Z direction and is smaller than the distance between the surface of the luminance equalizer sheet 13 on the light emitting substrate 11 side and the light reflection side surface of the reflective sheet 12. Thus, a front or top surface of the grid-shaped planar member 168c is spaced apart from the surface of the luminance equalizer sheet 13 on the light emitting substrate 11 side such that the front or top surface of the grid-shaped planar member 168c does not directly contact with the surface of the luminance equalizer sheet 13 on the light emitting substrate 11 side.

The other configuration of the ninth embodiment is the same as the eighth embodiment above.

Effect of Ninth Embodiment

In the ninth embodiment, as described above, the second holding member 16c has the columnar members 169 that contact the surface of the luminance equalizer sheet 13 on the light emitting substrate 11 side. With this configuration, the luminance equalizer sheet 13 can be prevented from bending toward the light emitting substrate 11 due to its own weight.

The other effects of the ninth embodiment are the same as those of the eighth embodiment.

Tenth Embodiment

Figure 15:
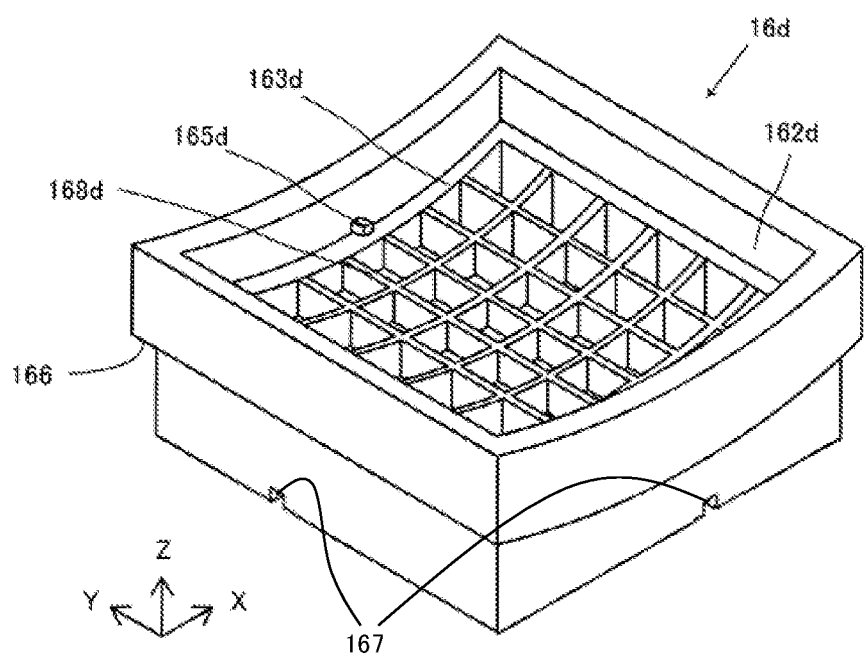
FIG. 15 is a perspective view of a second holding member in accordance with a tenth embodiment.
Figure 16:
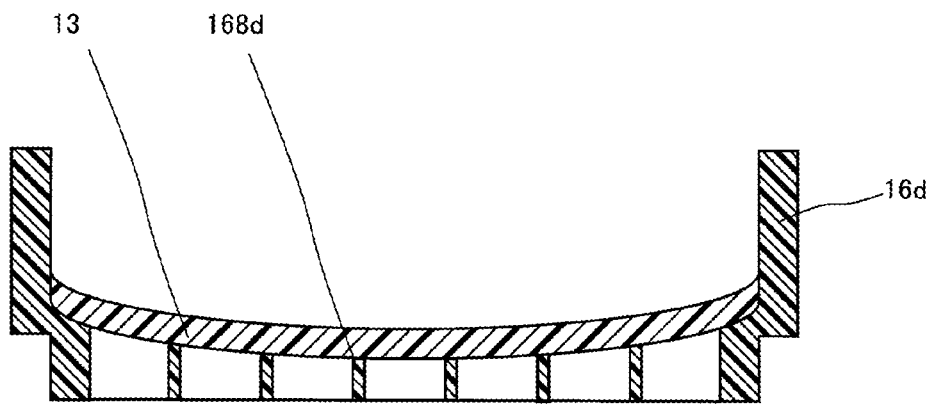
FIG. 16 is a cross-sectional view of the second holding member in accordance with the tenth embodiment.

Referring to FIGS. 15 and 16, the configuration of a display device according to a tenth embodiment will be explained. In view of the similarity between the first and tenth embodiments, the parts of the tenth embodiment that are similar or identical to the parts of the first embodiment will be given the same reference numerals as the parts of the first embodiment. Moreover, the descriptions of the parts of the tenth embodiment that are similar or identical to the parts of the first embodiment may be omitted for the sake of brevity.

In the tenth embodiment, unlike the eighth embodiment, the holding member 16 includes the first holding member 16a and a second holding member 16d that is provided on an inner peripheral surface side of the first holding member 16a. The second holding member 16d of the tenth embodiment is identical to the second holding member 16b of the eighth embodiment, expect that a grid-shaped partition wall 168d is provided in the opening of the second holding member 16d on the light emitting substrate 11 side. The grid-shaped partition wall 168d partitions each of the light emitting elements 111 and contacts a surface of the luminance equalizer sheet 13 on the light emitting substrate 11 side. In the illustrated embodiment, the grid-shaped partition wall 168d has a dimension (or height) in the Z direction that is larger than a dimension (or height) of the light emitting elements 111 in the Z direction and is equal to a distance between the surface of the luminance equalizer sheet 13 on the light emitting substrate 11 side and a light reflection side surface of the reflective sheet 12. Thus, a surface of the grid-shaped partition wall 168d on the luminance equalizer sheet 13 side contacts the luminance equalizer sheet 13, while a surface of the grid-shaped partition wall 168d on the light emitting substrate 11 side contacts the light reflection side surface of the reflective sheet 12.

The other configurations of the tenth embodiment are the same as the eighth embodiment above.

Effect of Tenth Embodiment

In the tenth embodiment, as described above, the second holding member 16d has the grid-shaped partition wall 168d that partitions each of the light emitting elements 111 and contacts the surface of the luminance equalizer sheet 13 on the light emitting substrate 11 side. With this configuration, partial dimming process called local dimming can be performed while preventing the luminance equalizer sheet 13 from bending toward the light emitting substrate 11 due to its own weight.

The other effects of the tenth embodiment are the same as those of the eighth embodiment.

Modification Examples

The embodiments disclosed here are illustrative and are not restrictive in all respects. The scope of the invention is indicated by the claims rather than by the description of the embodiments described above, and furthermore includes all modifications (modification examples) within the meaning and scope of the claims and their equivalents.

For example, in the first embodiment above, an example is shown in which the luminance equalizer sheet 13 has a curved shape or single curved shape that is convex toward the light emitting substrate 11, but the present invention is not limited to this. At least the one with the larger linear expansion coefficient among the light emitting substrate 11 and the luminance equalizer sheet 13 can have a double curved shape. Specifically, the luminance equalizer sheet 13 can have a curved cross sectional shape in both cross sections of the display device 100 taken along the X direction or a ZX plane and along the Y direction or a YZ plane. In particular, At least the one with the larger linear expansion coefficient among the light emitting substrate 11 and the luminance equalizer sheet 13 can have a dome shape that is convex toward or concave away from the one with the smaller linear expansion coefficient, and the degree of curvature of the one with the larger linear expansion coefficient can be configured to be larger than the degree of curvature of the one with the smaller linear expansion coefficient. For example, the luminance equalizer sheet 13, which has the linear expansion coefficient larger than the linear expansion coefficient of the light emitting substrate 11, can have a dome shape that is convex toward or concave away from the light emitting substrate 11, the light emitting substrate 11 can have a flat shape, and the degree of curvature of the luminance equalizer sheet 13 can be configured to be larger than the degree of curvature of the light emitting substrate 11. Even with this configuration, the same effects as those of the first to tenth embodiments can be obtained in the curved portion of the one with the larger linear expansion coefficient. Of course, the light emitting substrate 11 and the luminance equalizer sheet 13 each can have a double curved shape. Furthermore, in the second to fifth and seventh embodiments above, examples are shown in which the light emitting substrate 11 and the luminance equalizer sheet 13 each have a curved shape or single curved shape, but the present invention is not limited to this. For example, only one of the light emitting substrate 11 and the luminance equalizer sheet 13 can have a single curved shape, while the other one of the light emitting substrate 11 and the luminance equalizer sheet 13 can have a double curved shape or dome shape. Moreover, in the sixth embodiment, an example is show in which the light emitting substrate 11 has a single curved shape, while the luminance equalizer sheet 13 has a flat shape, but the present invention is not limited to this. For example, the light emitting substrate 11 can have a double curved shape, while the luminance equalizer sheet 13 has a flat shape.

For example, in the first embodiment above, an example is shown in which the luminance equalizer sheet 13 has a curved shape that is convex toward the light emitting substrate 11, but the present invention is not limited to this. For example, the luminance equalizer sheet 13 can have a curved shape that is convex toward the light emitting substrate 11 and further have a flat shape that is connected to one end of this curved portion. Even with this configuration, the same effects as those of the first to tenth embodiments can be obtained in the curved portion of the luminance equalizer sheet 13. The positioning positions of the light emitting substrate 11 and the luminance equalizer sheet 13 can be provided at the center portion of the holding member 16 in the X direction, or at a position away from the center portion of the holding member 16 in the X direction.

For example, the degree of curvature of the luminance equalizer sheet 13 can be asymmetrical in the X direction with respect to the positioning positions. Even with this configuration, the same effects as those of the first to tenth embodiments can be obtained. The positioning positions of the light emitting substrate 11 and the luminance equalizer sheet 13 can be provided at the center portions of the holding member 16 in the X direction, or at positions away from the center portions of the holding member 16 in the X direction. When the luminance equalizer sheet 13, which has the linear expansion coefficient larger than the linear expansion coefficient of the light emitting substrate 11, has a dome shape that is convex toward or concave away from the light emitting substrate 11, the light emitting substrate 11 has a flat shape, and the positioning positions of the light emitting substrate 11 and the luminance equalizer sheet 13 are provided at positions away from the center portions of the holding member 16 in the X direction, the shape of the luminance equalizer sheet 13 can be a semioval shape.

For example, in the first embodiment above, an example is shown in which the holding member 16 has the light emitting substrate engaging protrusions 164 and the luminance equalizer sheet engaging protrusions 165, the light emitting substrate 11 has the notches that engage with the light emitting substrate engaging protrusions 164, and the luminance equalizer sheet 13 has the notches that engage with the luminance equalizer sheet engaging protrusions 165, but the present invention is not limited to this. As long as the light emitting substrate 11 and luminance equalizer sheet 13 can be fixed to be relatively positioned via the holding member 16, the configuration of these engagements is not particularly limited.

For example, in the first embodiment above, an example is shown in which the light emitting substrate 11 and the luminance equalizer sheet 13 have a rectangular shape including four sides in plan view, but the present invention is not limited to this. For example, each part of the light emitting device 1 (the light emitting substrate 11, the reflective sheet 12, the luminance equalizer sheet 13, the diffusion member 14, the optical sheet 15 and the holding member 16) can be formed in a shape corresponding to the shape of the display panel 2, and can be circular, elliptical, polygonal, irregularly shaped (a shape including a concave or convex portion, for example), other than rectangular.

For example, in the first embodiment above, an example is shown in which the bottom portion 161 of the holding member 16 has three light emitting substrate engaging protrusions 164 that protrude inward from the side portions 162 along the X direction and the side portion 162 along the Y direction, but the present invention is not limited to this. The number of the light emitting substrate engaging protrusion 164 can be more than or less than three. For example, the bottom portion 161 of the holding member 16 can have only one light emitting substrate engaging protrusion 164 that protrudes inward from one side portion 162 along the X direction, or only two light emitting substrate engaging protrusion 164 that protrude inward from the side portions 162 along the X direction, respectively.

For example, in the first embodiment above, an example is shown in which the curved holding portion 163 of the holding member 16 has three luminance equalizer sheet engaging protrusions 165 that protrude inward from the side portions 162 along the X direction and the side portion 162 along the Y direction, but the present invention is not limited to this. The number of the luminance equalizer sheet engaging protrusion 165 can be more than or less than three. For example, the curved holding portion 163 of the holding member 16 can have only one luminance equalizer sheet engaging protrusion 165 that protrudes inward from one side portion 162 along the X direction, or only two luminance equalizer sheet engaging protrusion 165 that protrude inward from the side portions 162 along the X direction.

(1) In view of the state of the known technology and in accordance with a first aspect of the present invention, a light emitting device according to the first aspect comprises a light emitting substrate with a plurality of light emitting elements, and a luminance equalizer sheet provided opposite the light emitting substrate, having a plurality of through holes for transmitting light irradiated from the light emitting elements and having a linear expansion coefficient different from a linear expansion coefficient of the light emitting substrate, the light emitting substrate and the luminance equalizer sheet being positioned relative to each other at a predetermined position, at least one with a larger linear expansion coefficient among the light emitting substrate and the luminance equalizer sheet having a curved shape, and a degree of curvature of the one with the larger linear expansion coefficient being larger than a degree of curvature of one with a smaller linear expansion coefficient. Here, "a degree of curvature being small" of the present disclosure is a concept that includes not only being curved and having small amount of curvature, but also being a non-curved flat surface.

The luminance equalizer sheet faces the principal surface of the light emitting substrate on which the plurality of light emitting elements is arranged. In a preferable embodiment, the curved shape of the luminance equalizer sheet is a non-curved flat shape, convex toward the light emitting substrate or is concave away from the light emitting substrate. In another preferable embodiment, the curved shape of the light emitting substrate is a non-curved flat shape, convex toward the luminance equalizer sheet, or concave away from the luminance equalizer sheet. The above-mentioned preferable embodiments can be combined so that at least one of the luminance equalizer sheet and the light emitting substrate has the curved form which is convex or concave. In accordance with another preferred embodiment of any one of the light emitting devices mentioned above: the luminance equalizer sheet and the light emitting substrate primarily extend along a first axis and a second axis, and intersect a third axis which is perpendicular to the first and second axes; and the curved shape of the luminance equalizer sheet and the light emitting substrate lies within a cross-sectional view which extends along the first and the third axes. In accordance with another preferred embodiment of any one of the light emitting devices mentioned above, the predetermined position is located at a center position with respect to the first axis. In accordance with another preferred embodiment of any one of the light emitting devices mentioned above: at least one of the light emitting substrate and the luminance equalizer sheet is curved within the plane extending along the first and third axes such that an angle between a tangent plane or a plane of the light emitting substrate and a tangent plane or a plane of the luminance equalizer sheet increases as moving away along the first axis from the predetermined position, the tangent plane or the plane of the luminance equalizer sheet is a tangent plane identified on a line where the luminance equalizer sheet intersects another plane perpendicular to the tangent plane or the plane of the light emitting substrate.

In the light emitting device according to the first aspect, as described above, at least the one with the larger linear expansion coefficient among the light emitting substrate and the luminance equalizer sheet has the curved shape, and the degree of curvature of the one with the larger linear expansion coefficient is larger than the degree of curvature of the one with the smaller linear expansion coefficient. By making the one with the larger linear expansion coefficient more curved, a positional shift amount of the one with the larger linear expansion coefficient relative to the one with the smaller linear expansion coefficient can be reduced at a position away from the predetermined position. In other words, if a positional shift direction caused by the expansion of the one with the smaller linear expansion coefficient is a reference direction, then the one with the larger linear expansion coefficient expands in a direction that is inclined relative to the reference direction due to the curvature. As a result, the expansion of the one with the larger linear expansion coefficient includes an orthogonal direction component in a direction orthogonal to the reference direction, in addition to a reference direction component corresponding to the positional shift. The positional shift (the reference direction component) can be reduced by the amount of this orthogonal direction component caused by the curvature. With this configuration, deterioration of luminance uniformity caused by temperature changes can be suppressed by reducing misalignment of the relative positional relationship of the light emitting substrate and the luminance equalizer sheet caused by temperature changes.

(2) In accordance with a preferred embodiment according to the light emitting device mentioned above, at least one of the light emitting substrate and the luminance equalizer sheet is curved such that an angle between a tangent plane or a plane of the light emitting substrate and a tangent plane or a plane of the luminance equalizer sheet in a perpendicular direction of the tangent plane or the plane of the light emitting substrate increases as moving away from the predetermined position. Here, the farther away from the predetermined position, the larger the positional shift amount due to expansion. Therefore, with the configuration above, the amount of the orthogonal direction component generated in the one with the larger linear expansion coefficient can be increased as moving away from the predetermined position, and thus an amount of decrease in the reference direction component can be increased as moving away from the predetermined position. With this configuration, deterioration of luminance uniformity caused by temperature changes can be further suppressed by further reducing misalignment of the relative positional relationship of the light emitting substrate and the luminance equalizer sheet caused by temperature changes.

(3) In accordance with a preferred embodiment according to any one of the light emitting devices mentioned above, the predetermined position is located on a plane on which a plane orthogonal to a tangent plane of the one with the larger linear expansion coefficient overlaps a plane orthogonal to a tangent plane or a plane of the one with the smaller linear expansion coefficient. With this configuration, since the light emitting substrate and luminance equalizer sheet, at least one of which is curved, can be stably fixed at the predetermined position, the assemblability of the luminance equalizer sheet can be improved.

(4) In accordance with a preferred embodiment according to any one of the light emitting devices mentioned above, the linear expansion coefficient of the luminance equalizer sheet is larger than the linear expansion coefficient of the light emitting substrate, the luminance equalizer sheet has a curved shape that is convex toward the light emitting substrate or a curved shape that is concave away from the light emitting substrate, and the light emitting substrate has a flat shape, a curved shape that has a smaller degree of curvature than the luminance equalizer sheet and is convex toward the luminance equalizer sheet, or a curved shape that has a smaller degree of curvature than the luminance equalizer sheet and is concave away from the luminance equalizer sheet. With this configuration, even if the luminance equalizer sheet has a curved shape and the light emitting substrate has a flat shape or a curved shape, the positional shift amount of the luminance equalizer sheet, which has a larger linear expansion coefficient, with respect to the light emitting substrate, which has a smaller linear expansion coefficient, can be reduced at a position away from the predetermined position. As a result, the deterioration of luminance uniformity can be suppressed.

(5) In accordance with a preferred embodiment according to any one of the light emitting devices mentioned above, the linear expansion coefficient of the luminance equalizer sheet is smaller than the linear expansion coefficient of the light emitting substrate, the luminance equalizer sheet has a flat shape, a curved shape that is convex toward the light emitting substrate, or a curved shape that is concave away from the light emitting substrate, and the light emitting substrate has a curved shape that has a larger degree of curvature than the luminance equalizer sheet and is convex toward the luminance equalizer sheet, or a curved shape that has a larger degree of curvature than the luminance equalizer sheet and is concave away from the luminance equalizer sheet. With this configuration, even if the luminance equalizer sheet has a flat shape or a curved shape and the light emitting substrate has a curved shape, the positional shift amount of the light emitting substrate, which has a larger linear expansion coefficient, with respect to the luminance equalizer sheet, which has a smaller linear expansion coefficient, can be reduced at a position away from the predetermined position. As a result, the deterioration of luminance uniformity can be suppressed.

(6) In accordance with a preferred embodiment according to any one of the light emitting devices mentioned above, in the configuration in which the linear expansion coefficient of the luminance equalizer sheet is larger than the linear expansion coefficient of the light emitting substrate and the degree of curvature of the luminance equalizer sheet is larger than the degree of curvature of the light emitting substrate, or the configuration in which the linear expansion coefficient of the luminance equalizer sheet is smaller than the linear expansion coefficient of the light emitting substrate and the degree of curvature of the luminance equalizer sheet is smaller than the degree of curvature of the light emitting substrate above, the light emitting device further comprises a diffusion member disposed on an opposite side of the luminance equalizer sheet from the light emitting substrate and having a curved shape corresponding to the curved shape of the luminance equalizer sheet. With this configuration, the degree of curvature of the luminance equalizer sheet, which has a curved shape, can be appropriately maintained by the diffusion member. As a result, the deterioration of luminance uniformity caused by temperature changes can be suppressed.

(7) In accordance with a preferred embodiment according to any one of the light emitting devices mentioned above, the light emitting device further comprises an optical sheet disposed on an opposite side of the diffusion member from the luminance equalizer sheet and has a curved shape corresponding to the curved shape of the luminance equalizer sheet. With this configuration, the degree of curvature of the luminance equalizer sheet, which has a curved shape, can be more appropriately maintained. Therefore, the deterioration of luminance uniformity caused by temperature changes can be further suppressed.

(8) In accordance with a preferred embodiment according to any one of the light emitting devices mentioned above, the light emitting device further comprises a holding member holding the light emitting substrate and the luminance equalizer sheet.

(9) In accordance with a preferred embodiment according to any one of the light emitting devices mentioned above, the holding member includes a curved holding portion having a curved shape for holding curvature of the luminance equalizer sheet. With this configuration, a luminance equalizer sheet with a desired curved shape can be configured simply by placing a luminance equalizer sheet formed by a flexible sheet on the curved holding portion.

(10) In accordance with a preferred embodiment according to any one of the light emitting devices mentioned above, the curved holding portion includes an engaging protrusion that engages with the luminance equalizer sheet.

(11) In accordance with a preferred embodiment according to any one of the light emitting devices mentioned above, the holding member includes a bottom portion on which the light emitting substrate is disposed.

(12) In accordance with a preferred embodiment according to any one of the light emitting devices mentioned above, the holding member includes a first holding member and a second holding member that is provided on an inner peripheral surface side of the first holding member and is formed of a material with a higher reflectivity than the first holding member. With this configuration, the light utilization efficiency can be improved by reflecting the light with the second holding member. As a result, the luminance of the light emitting device can be improved. The first holding member has a tubular-like side portion and a bottom portion. The light emitting substrate is fixed to the first holding member. Preferably, the second holding member has a tubular-like shape which is configured to fit to the inner surface of the side portion of the first holding member. The second holding member is configured to hold the peripheral portion of the luminance equalizer sheet.

(13) In accordance with a preferred embodiment according to any one of the light emitting devices mentioned above, the second holding member has a columnar member that contacts a surface of the luminance equalizer sheet on the light emitting substrate side. With this configuration, the luminance equalizer sheet can be prevented from bending toward the light emitting substrate due to its own weight.

(14) In accordance with a preferred embodiment according to any one of the light emitting devices mentioned above, in the configuration in which the holding member includes the first holding member and the second holding member above, the second holding member has a partition wall that partitions each of the light emitting elements and contacts a surface of the luminance equalizer sheet on the light emitting substrate side. With this configuration, partial dimming process called local dimming can be performed while preventing the luminance equalizer sheet from bending toward the light emitting substrate due to its own weight.

(15) In view of the state of the known technology and in accordance with a second aspect of the present invention, a display device according to the second aspect comprises any one of the light emitting devices mentioned above, and a display panel, the luminance equalizer sheet having a curved shape, and the display panel being disposed on the luminance equalizer sheet side of the light emitting device and having a curved shape that corresponds to the curved shape of the luminance equalizer sheet.

In the display device according to the second aspect, as described above, at least the one with the larger linear expansion coefficient among the light emitting substrate and the luminance equalizer sheet has the curved shape, and the degree of curvature of the one with the larger linear expansion coefficient is larger than the degree of curvature of the one with the smaller linear expansion coefficient. By making the one with the larger linear expansion coefficient more curved, a positional shift amount of the one with the larger linear expansion coefficient relative to the one with the smaller linear expansion coefficient can be reduced at a position away from the predetermined position. In other words, if a positional shift direction caused by the expansion of the one with the smaller linear expansion coefficient is a reference direction, then the one with the larger linear expansion coefficient expands in a direction that is inclined relative to the reference direction due to the curvature. As a result, the expansion of the one with the larger linear expansion coefficient includes an orthogonal direction component in a direction orthogonal to the reference direction, in addition to a reference direction component corresponding to the positional shift. The positional shift (the reference direction component) can be reduced by the amount of this orthogonal direction component caused by the curvature. With this configuration, deterioration of luminance uniformity caused by temperature changes can be suppressed by reducing misalignment of the relative positional relationship of the light emitting substrate and the luminance equalizer sheet caused by temperature changes.

(16) In accordance with a preferred embodiment according to any one of the light emitting devices mentioned above, the curved shape of the least one with the larger linear expansion coefficient among the light emitting substrate and the luminance equalizer sheet is a single curved shape.

(17) In accordance with a preferred embodiment according to any one of the light emitting devices mentioned above, the curved shape of the least one with the larger linear expansion coefficient among the light emitting substrate and the luminance equalizer sheet is a double curved shape.

(18) In accordance with a preferred embodiment according to any one of the light emitting devices mentioned above, the bottom portion has a flat shape for holding the light emitting substrate.

(19) In accordance with a preferred embodiment according to any one of the light emitting devices mentioned above, the bottom portion has a curved shape for holding curvature of the light emitting substrate.

(20) In accordance with a preferred embodiment according to any one of the light emitting devices mentioned above, the second holding member has a grid-shaped planar member that partitions each of the light emitting elements and is spaced apart from a surface of the luminance equalizer sheet on the light emitting substrate side.

With the present disclosure, as described above, a light emitting device and a display device can be provided that can suppress deterioration of luminance uniformity caused by temperature changes by reducing misalignment of the relative positional relationship of the light emitting substrate and the luminance equalizer sheet caused by temperature changes.

In accordance with a first mode of a third aspect, a light emitting device comprises: a light emitting substrate with a plurality of light emitting elements; and a luminance equalizer sheet provided opposite the light emitting substrate, having a plurality of through holes for transmitting light irradiated from the light emitting elements and having a linear expansion coefficient different from a linear expansion coefficient of the light emitting substrate, the light emitting substrate and the luminance equalizer sheet being positioned relative to each other at a predetermined position, at least one with a larger linear expansion coefficient among the light emitting substrate and the luminance equalizer sheet having a curved shape, and a degree of curvature of the one with the larger linear expansion coefficient being larger than a degree of curvature of one with a smaller linear expansion coefficient among the light emitting substrate and the luminance equalizer sheet.

In accordance with a second mode, with the light emitting device according to the first mode, at least one of the light emitting substrate and the luminance equalizer sheet is curved such that an angle between a tangent plane or a plane of the light emitting substrate and a tangent plane or a plane of the luminance equalizer sheet in a perpendicular direction of the tangent plane or the plane of the light emitting substrate increases as moving away from the predetermined position.

In accordance with a third mode, with the light emitting device according to the first mode, the predetermined position is located on a plane on which a plane orthogonal to a tangent plane of the one with the larger linear expansion coefficient overlaps a plane orthogonal to a tangent plane or a plane of the one with the smaller linear expansion coefficient.

In accordance with a fourth mode, with the light emitting device according to the first mode, the linear expansion coefficient of the luminance equalizer sheet is larger than the linear expansion coefficient of the light emitting substrate, the luminance equalizer sheet has a curved shape that is convex toward the light emitting substrate or a curved shape that is concave away from the light emitting substrate, and the light emitting substrate has a flat shape, a curved shape that has a smaller degree of curvature than the luminance equalizer sheet and is convex toward the luminance equalizer sheet, or a curved shape that has a smaller degree of curvature than the luminance equalizer sheet and is concave away from the luminance equalizer sheet.

In accordance with a fifth mode, with the light emitting device according to the first mode, the linear expansion coefficient of the luminance equalizer sheet is smaller than the linear expansion coefficient of the light emitting substrate, the luminance equalizer sheet has a flat shape, a curved shape that is convex toward the light emitting substrate, or a curved shape that is concave away from the light emitting substrate, and the light emitting substrate has a curved shape that has a larger degree of curvature than the luminance equalizer sheet and is convex toward the luminance equalizer sheet, or a curved shape that has a larger degree of curvature than the luminance equalizer sheet and is concave away from the luminance equalizer sheet.

In accordance with a sixth mode, the light emitting device according to the fourth mode further comprises a diffusion member disposed on an opposite side of the luminance equalizer sheet from the light emitting substrate and having a curved shape corresponding to the curved shape of the luminance equalizer sheet.

In accordance with a seventh mode, the light emitting device according to the sixth mode further comprises an optical sheet disposed on an opposite side of the diffusion member from the luminance equalizer sheet and having a curved shape corresponding to the curved shape of the luminance equalizer sheet.

In accordance with an eighth mode, the light emitting device according to the first mode further comprises a holding member holding the light emitting substrate and the luminance equalizer sheet.

In accordance with a ninth mode, with the light emitting device according to the eighth mode, the holding member includes a curved holding portion having a curved shape for holding curvature of the luminance equalizer sheet.

In accordance with a tenth mode, with the light emitting device according to the ninth mode, the curved holding portion includes an engaging protrusion that engages with the luminance equalizer sheet.

In accordance with an eleventh mode, with the light emitting device according to the eighth mode, the holding member includes a bottom portion on which the light emitting substrate is disposed.

In accordance with a twelfth mode, with the light emitting device according to the eighth mode, the holding member includes a first holding member and a second holding member that is provided on an inner peripheral surface side of the first holding member and is formed of a material with a higher reflectivity than the first holding member.

In accordance with a thirteenth mode, with the light emitting device according to the twelfth mode, the second holding member has a columnar member that contacts a surface of the luminance equalizer sheet on the light emitting substrate side.

In accordance with a fourteenth mode, with the light emitting device according to the twelfth mode, the second holding member has a partition wall that partitions each of the light emitting elements and contacts a surface of the luminance equalizer sheet on the light emitting substrate side.

In accordance with a fifteenth mode, a display device comprises: the light emitting device according to the first mode; and a display panel, the luminance equalizer sheet having a curved shape, and the display panel being disposed on the luminance equalizer sheet side of the light emitting device and having a curved shape that corresponds to the curved shape of the luminance equalizer sheet.

In accordance with a sixteenth mode, with the light emitting device according to the first mode, the curved shape of the one with the larger linear expansion coefficient among the light emitting substrate and the luminance equalizer sheet is a single curved shape.

In accordance with a seventeenth mode, with the light emitting device according to the first mode, the curved shape of the least one with the larger linear expansion coefficient among the light emitting substrate and the luminance equalizer sheet is a double curved shape.

In accordance with an eighteenth mode, with the light emitting device according to the eleventh mode, the bottom portion has a flat shape for holding the light emitting substrate.

In accordance with a nineteenth mode, with the light emitting device according to the eleventh mode, the bottom portion has a curved shape for holding curvature of the light emitting substrate.

In accordance with a twentieth mode, with the light emitting device according to the twelfth mode, the second holding member has a grid-shaped planar member that partitions each of the light emitting elements and is spaced apart from a surface of the luminance equalizer sheet on the light emitting substrate side.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a display device in an upright position. Accordingly, these directional terms, as utilized to describe the display device should be interpreted relative to a display device in an upright position. The terms "left" and "right" are used to indicate the "right" when referencing from the right side as viewed from the front of the display device, and the "left" when referencing from the left side as viewed from the front of the display device.

Also it will be understood that although the terms "first" and "second" may be used herein to describe various components these components should not be limited by these terms. These terms are only used to distinguish one component from another. Thus, for example, a first component discussed above could be termed a second component and vice-a-versa without departing from the teachings of the present invention. The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A light emitting device comprising:
   a light emitting substrate with a plurality of light emitting elements;
   a luminance equalizer sheet provided opposite the light emitting substrate and having a plurality of through holes for transmitting light irradiated from the light emitting elements; and
   a holding member having a first holding surface that supports the light emitting substrate and has a first engagement portion that is engaged with the first emitting substrate, and a second holding surface that supports at least an edge portion of the luminance equalizer sheet and has a second engagement portion that is engaged with the edge portion of the luminance equalizer sheet,
   the first engagement portion and the second engagement portion being aligned with respect to each other on a predetermined plane, and
   a distance between the first holding surface and the second holding surface increasing or decreasing as moving away from the predetermined plane.

2. The light emitting device according to claim 1, wherein an angle between a tangent plane of the first holding surface and a tangent plane of the second holding surface increases as moving away from the predetermined plane.

3. The light emitting device according to claim 1, wherein the predetermined plane is a vertical center plane of the holding member.

4. The light emitting device according to claim 1, wherein the second holding surface has a curved shape that is convex toward the light emitting substrate or a curved shape that is concave away from the light emitting substrate, and
the first holding surface has a flat shape, a curved shape that has a smaller degree of curvature than the second holding surface and is convex toward the luminance equalizer sheet, or a curved shape that has a smaller degree of curvature than the second holding surface and is concave away from the luminance equalizer sheet.

5. The light emitting device according to claim 4, further comprising
a diffusion member disposed on an opposite side of the luminance equalizer sheet from the light emitting substrate,
the luminance equalizer sheet and the diffusion member having a curved shape corresponding to the curved shape of the second holding surface.

6. The light emitting device according to claim 5, further comprising
an optical sheet disposed on an opposite side of the diffusion member from the luminance equalizer sheet and having a curved shape corresponding to the curved shape of the luminance equalizer sheet and the diffusion member.

7. The light emitting device according to claim 1, wherein the second holding surface has a flat shape, a curved shape that is convex toward the light emitting substrate, or a curved shape that is concave away from the light emitting substrate, and
the first holding surface has a curved shape that has a larger degree of curvature than the second holding surface and is convex toward the luminance equalizer sheet, or a curved shape that has a larger degree of curvature than the second holding surface and is concave away from the luminance equalizer sheet.

8. The light emitting device according to claim 1, wherein the second holding surface has a curved shape for holding the luminance equalizer sheet in a curved state.

9. The light emitting device according to claim 1, wherein the first engagement portion is engaged with a notch provided to the light emitting substrate, and
the second engagement portion is engaged with a notch provided to the edge portion of the luminance equalizer sheet.

10. The light emitting device according to claim 1, wherein the first holding surface forms a bottom surface of the holding member on which the light emitting substrate is disposed.

11. The light emitting device according to claim 1, wherein
the holding member includes a first holding member with the first holding surface and a second holding member with the second holding surface, the first holding member and the second holding member being independently provided relative to each other as separate members.

12. The light emitting device according to claim 11, wherein
the second holding member is provided on an inner peripheral surface side of the first holding member and is formed of a material with a higher reflectivity than the first holding member.

13. The light emitting device according to claim 11, wherein
the second holding member has a columnar member that contacts a surface of the luminance equalizer sheet on the light emitting substrate side.

14. The light emitting device according to claim 11, wherein
the second holding member has a partition wall that partitions each of the light emitting elements and contacts a surface of the luminance equalizer sheet on the light emitting substrate side.

15. The light emitting device according to claim 11, wherein
the second holding member has a grid-shaped planar member that partitions each of the light emitting elements and is spaced apart from a surface of the luminance equalizer sheet on the light emitting substrate side.

16. The light emitting device according to claim 1, wherein
at least one of the light emitting substrate and the luminance equalizer sheet has a single curved shape while being supported by the holding member.

17. The light emitting device according to claim 1, wherein
at least one of the light emitting substrate and the luminance equalizer sheet has a double curved shape while being supported by the holding member.

18. The light emitting device according to claim 1, wherein
the first holding surface has a flat shape for holding the light emitting substrate in a flat state.

19. The light emitting device according to claim 1, wherein
the first holding surface has a curved shape for holding the light emitting substrate in a curved state.

20. A display device comprising:
the light emitting device according to claim 1; and
a display panel,
the luminance equalizer sheet having a curved shape, and
the display panel being disposed on the luminance equalizer sheet side of the light emitting device and having a curved shape that corresponds to the curved shape of the luminance equalizer sheet.

* * * * *